(12) United States Patent
Wang et al.

(10) Patent No.: US 11,561,581 B2
(45) Date of Patent: Jan. 24, 2023

(54) VIRTUAL DISPLAY APPARATUS, AND METHODS OF MANUFACTURING AND CONTROLLING THE SAME

(71) Applicants: BEIJING BOE DISPLAY TECHNOLOGY CO., LTD., Beijing (CN); BOE TECHNOLOGY GROUP CO., LTD., Beijing (CN)

(72) Inventors: Mingchao Wang, Beijing (CN); Xuewei Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 50 days.

(21) Appl. No.: 16/887,362

(22) Filed: May 29, 2020

(65) Prior Publication Data
US 2021/0165455 A1 Jun. 3, 2021

(30) Foreign Application Priority Data
Nov. 29, 2019 (CN) .......................... 201911202964.3

(51) Int. Cl.
*G06F 1/16* (2006.01)
*G02B 27/01* (2006.01)
(Continued)

(52) U.S. Cl.
CPC ....... *G06F 1/1652* (2013.01); *G02B 27/0149* (2013.01); *G03H 1/0005* (2013.01);
(Continued)

(58) Field of Classification Search
CPC ........ G02B 2027/0163; G02B 27/0149; G02B 30/27; G03H 1/0005; G06F 1/1609;
(Continued)

(56) References Cited

U.S. PATENT DOCUMENTS

2017/0353717 A1 12/2017 Zhou et al.
2018/0204890 A1* 7/2018 Akimoto .............. G06V 40/172
(Continued)

FOREIGN PATENT DOCUMENTS

CN 104469343 A 3/2015
CN 204229762 U * 3/2015
(Continued)

OTHER PUBLICATIONS

Machine translation of CN 204229762 U (Year: 2015).*
(Continued)

*Primary Examiner* — Christopher S Kelley
*Assistant Examiner* — Ana Picon-Feliciano
(74) *Attorney, Agent, or Firm* — McDermott Will & Emery LLP

(57) ABSTRACT

A virtual display apparatus includes: a flexible display component layer having a light exit surface and a non-light exit surface opposite to the light exit surface; a lens layer disposed at the light exit surface of the flexible display component layer, and configured to converge light; a curvature adjustment layer disposed on the non-light exit surface of the flexible display component layer. The lens layer has a first surface facing the flexible display component layer, and the first surface of the lens layer and the light exit surface of the flexible display component layer have a gap therebetween. The curvature adjustment layer is configured to deform in response to at least one deformation signal, so as to adjust distances between the first surface of the lens layer and different positions of the light exit surface of the flexible display component layer along a thickness direction of the lens layer.

19 Claims, 8 Drawing Sheets

(51) Int. Cl.
  *G09F 9/30* (2006.01)
  *G03H 1/00* (2006.01)
(52) U.S. Cl.
  CPC .......... *G06F 1/1609* (2013.01); *G06F 1/1615* (2013.01); *G09F 9/301* (2013.01); *G02B 2027/0163* (2013.01)
(58) Field of Classification Search
  CPC .... G06F 1/1615; G06F 1/1637; G06F 1/1652; G06F 9/301; G06F 2203/04102; H01L 2251/5338; H01L 27/3232; H01L 51/5275; H01L 51/0096; H01L 51/0097; G02F 1/133305; G02F 1/1343; G09F 9/301
  USPC .......................................................... 348/46
  See application file for complete search history.

(56) References Cited

U.S. PATENT DOCUMENTS

| | | | |
|---|---|---|---|
| 2018/0232189 A1 | 8/2018 | Yang et al. | |
| 2018/0372924 A1* | 12/2018 | Gao | ..................... G02B 3/0037 |
| 2019/0340959 A1* | 11/2019 | Park | ................... H01L 51/5036 |
| 2020/0233211 A1 | 7/2020 | Li et al. | |
| 2020/0295308 A1* | 9/2020 | Baek | ................... H01L 51/5275 |
| 2020/0335719 A1 | 10/2020 | Xu et al. | |
| 2021/0003900 A1* | 1/2021 | Chen | ................... H01L 51/5275 |

FOREIGN PATENT DOCUMENTS

| | | | | |
|---|---|---|---|---|
| CN | 204229762 U | 3/2015 | | |
| CN | 105072436 A | 11/2015 | | |
| CN | 106066698 A | 11/2016 | | |
| CN | 205670419 U | 11/2016 | | |
| CN | 205787478 U | 12/2016 | | |
| CN | 106444058 A | 2/2017 | | |
| CN | 106773060 A | 5/2017 | | |
| CN | 108615822 A | 10/2018 | | |
| CN | 109444998 A | 3/2019 | | |
| CN | 109782445 A | 5/2019 | | |
| EP | 3905226 A1 * | 11/2021 | ............. | G09F 9/335 |
| JP | H07-168533 A | 7/1995 | | |

OTHER PUBLICATIONS

First Office Action issued in Chinese Patent Application No. 201911202964.3, dated Mar. 29, 2021; with partial English translation.

* cited by examiner

A plurality of first electrodes are formed on the non-light exit surface of the flexible display component layer, and each first electrode is located in a respective one of the plurality of sub-pixel regions — S110

A plurality of second electrodes are formed on the curvature adjustment base layer, and each second electrode is located in a respective one of a plurality of sub-regions — S120

A sealing wall and a plurality of separating walls located in a region surrounded by the sealing wall are formed on the flexible display component layer on which the plurality of first electrodes have been formed, or on the curvature adjustment base layer on which the plurality of second electrodes have been formed, so as to form a plurality of liquid accommodation spaces — S130

Electrorheological fluid is filled in each of the plurality of liquid accommodation spaces — S140

The curvature adjustment base layer and the flexible display component layer are aligned, so that an orthographic projection of each sub-region on the flexible display component layer overlaps with a respective one of the plurality of the sub-pixel regions — S150

The curvature adjustment base layer and the flexible display component layer are sealed by the sealing wall — S160

FIG. 11

```
┌─────────────────────────────────────────────────────────────┐
│ A first conductive layer is deposited on the non-light exit │──S111
│ surface of the flexible display component layer             │
└─────────────────────────────────────────────────────────────┘
                              ⋮
┌─────────────────────────────────────────────────────────────┐
│ The first conductive layer is etched to form the plurality  │
│ of first electrodes spaced apart from each other. Each      │──S112
│ first electrode is located in the corresponding sub-pixel   │
│ region                                                      │
└─────────────────────────────────────────────────────────────┘
```

FIG. 12

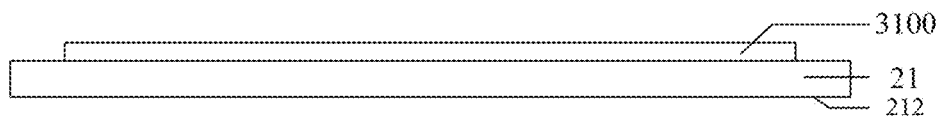

FIG. 13A

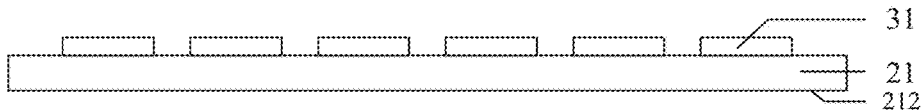

FIG. 13B

```
┌─────────────────────────────────────────────────────────────┐
│ A second conductive layer is deposited on the curvature     │──S121
│ adjustment base layer                                       │
└─────────────────────────────────────────────────────────────┘
                              ⋮
┌─────────────────────────────────────────────────────────────┐
│ The second conductive layer is etched to form the plurality │
│ of second electrodes spaced apart from each other. Each     │──S122
│ second electrode is located in a corresponding sub-region   │
└─────────────────────────────────────────────────────────────┘
```

FIG. 14

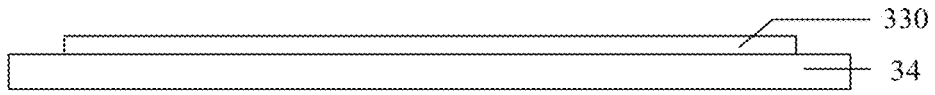

FIG. 15A

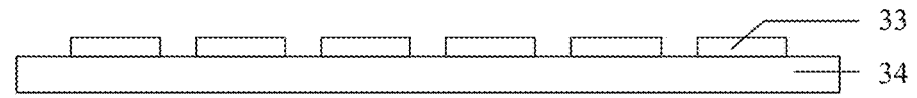

FIG. 15B

A first indium tin oxide layer is deposited on the third surface of the first flexible base layer, and the first indium tin oxide layer is etched to form first electrodes and first lead wires. The first electrodes are arranged at intervals, and each first electrode is located in a corresponding sub-pixel region and is connected to a first lead wire ——S210

A second indium tin oxide layer is deposited on the curvature adjusting base layer, and the second indium tin oxide layer is etched to form second electrodes and second lead wires. The second electrodes are arranged at intervals, and each second electrode is located in a corresponding sub-region and is connected to a second lead wire ——S220

A sealing wall and a plurality of separating walls are formed on the curvature adjustment layer, so as to form a plurality of liquid accommodation spaces ——S230

The electrorheological fluid is filled in each of the plurality of the liquid accommodation spaces ——S240

The curvature adjustment layer and the first flexible base layer are aligned, so that an orthographic projection of eAch sub-region on the flexible display component layer overlaps with a respective one of the plurality of the sub-pixel regions; and the curvature adjustment base layer and the first flexible base layer are sealed to form the plurality of enclosed liquid accommodation spaces ——S250

A thin film transistor layer, a light emitting functional layer and a second flexible base layer are formed sequentially on the second surface of the first flexible base layer to obtain a flexible display component layer ——S260

Edges of the first surface of the lens layer and edges of the light exit surface of the flexible display component layer are bonded, so that the lens layer and the flexible display component layer have a gap therebetween ——S270

FIG. 16

VIRTUAL DISPLAY APPARATUS, AND
METHODS OF MANUFACTURING AND
CONTROLLING THE SAME

CROSS-REFERENCE TO RELATED
APPLICATION

This application claims priority to Chinese Patent Application No. 201911202964.3, filed on Nov. 29, 2019, which is incorporated herein by reference in its entirety.

TECHNICAL FIELD

The present disclosure relates to the field of display technologies, and in particular, to a virtual display apparatus, and methods of manufacturing and controlling the same.

BACKGROUND

Virtual reality (VR) is a technology that uses the computer technology to create a three-dimensional (3D) simulated environment, and provides simulations of senses such as vision, hearing, and touch, so that the users can be immersed and experience real feelings in the simulated environment. Augmented reality (AR) is a technology that adds layers of digital information onto a real-world environment, so that the real-word environment and the virtual object can exist in the same image or space to provide users with sensory experience beyond reality.

Whether it is a VR display apparatus or an AR display apparatus, it will involve display of 3D images. At present, the VR display apparatus and the AR display apparatus may achieve the display of the 3D image by generating a left-eye image and a right-eye image based on the 3D image.

SUMMARY

In the first aspect, provided is a virtual display apparatus, comprising a flexible display component layer, a lens layer and a curvature adjustment layer. The flexible display component layer has a light exit surface and a non-light exit surface opposite to the light exit surface, and the light exit surface is a surface via which light emitted by the flexible display component layer exits therefrom. The lens layer is disposed at the light exit surface of the flexible display component layer and configured to converge the light. The lens layer has a first surface facing the flexible display component layer, and the first surface of the lens layer and the light exit surface of the flexible display component layer have a gap therebetween. The curvature adjustment layer is disposed on the non-light exit surface of the flexible display component layer. The curvature adjustment layer is configured to deform in response to at least one deformation signal, so as to adjust distances between the first surface of the lens layer and different positions of the light exit surface of the flexible display component layer along a thickness direction of the lens layer.

In some embodiments, the curvature adjustment layer includes: a curvature adjustment base layer, a sealing wall, a plurality of curvature adjustment units, and a plurality of separating walls. The sealing wall is disposed between the curvature adjustment base layer and the flexible display component layer, and the sealing wall, the curvature adjustment base layer and the flexible display component layer together form a cavity. The plurality of curvature adjustment units are disposed in the cavity. Each curvature adjustment unit includes a first electrode and a second electrode that are disposed oppositely along the thickness direction of the lens layer, and electrorheological fluid located between the first electrode and the second electrode. The plurality of separating walls disposed in the cavity, and electrorheological fluid of every two adjacent curvature adjustment units are separated by at least one separating wall.

In some embodiments, all first electrodes are disposed on the non-light exit surface of the flexible display component layer, and all second electrodes are disposed on a surface of the curvature adjustment base layer facing the flexible display component layer.

In some embodiments, the flexible display component layer has a plurality of sub-pixel regions, and an orthographic projection of each curvature adjustment unit on the flexible display component layer overlaps with a corresponding sub-pixel region.

In some embodiments, the curvature adjustment layer further includes at least one first lead wire disposed at a side of the flexible display component layer proximate to the curvature adjustment base layer, and at least one second lead wire disposed at a side of the curvature adjustment base layer proximate to the flexible display component layer. All the first electrodes are spaced apart from each other, and the at least one first lead wire includes a plurality of first lead wires, and one of the plurality of first lead wires is electrically connected to a first electrode of a corresponding curvature adjustment unit; and all the second electrodes are spaced apart from each other, and the at least one second lead wire includes a plurality of second lead wires, and one of the plurality of second lead wires is electrically connected to a second electrode of the corresponding curvature adjustment unit. Or, all the first electrodes are integrally formed, and the at least one first lead wire is electrically connected to the first electrodes; and all second electrodes are spaced apart from each other, and the at least one second lead wire includes a plurality of second lead wires, and one of the plurality of second lead wires is electrically connected to a second electrode of a corresponding curvature adjusting unit. Or, all the second electrodes are integrally formed, and the at least one second lead wire is electrically connected to the second electrodes; and all the first electrodes are spaced apart from each other, and the at least one first lead wire includes a plurality of first lead wires, and one of the plurality of first lead wires is electrically connected to a first electrode of a corresponding curvature adjustment unit.

In some embodiments, the virtual display apparatus further includes a controller. The at least one first lead wire and the at least one second lead wire are electrically connected to the controller; and the at least one deformation signal includes voltage signals, and the controller is configured to provide voltage signals to first electrodes and second electrodes of the plurality of curvature adjustment units.

In some embodiments, a material of the plurality of separating walls and the sealing wall is a sealant.

In some embodiments, the lens layer is a planar metalens.

In some embodiments, the virtual display apparatus further includes a frame sealant disposed between the lens layer and the flexible display component layer to seal the lens layer and the flexible display component layer.

In some embodiments, the flexible display component layer includes a first flexible base layer and a multi-layer structure stacked along the thickness direction of the lens layer, and the multi-layer structure is closer to the lens layer than the first flexible base layer. The multi-layer structure includes a second flexible base layer, a light-emitting functional layer and a thin film transistor layer that are stacked. The second flexible base layer is disposed at a side of the light-emitting functional layer proximate to the lens layer, and the thin film transistor layer is disposed at another side of the light-emitting functional layer proximate to the first flexible base layer.

In the second aspect, provided is a method of manufacturing the virtual display apparatus, including: providing the flexible display component layer; forming the curvature adjustment layer on the non-light exit surface of the flexible display component layer; and bonding edges of the lens layer and edges of the light exit surface of the flexible display component layer, so that the lens layer and the flexible display component layer have a gap therebetween.

In some embodiments, the flexible display component layer has a plurality of sub-pixel regions. Forming the curvature adjustment layer includes: forming a plurality of first electrodes on the non-light exit surface of the flexible display component layer, each first electrode located in a respective one of the plurality of sub-pixel regions; forming a plurality of second electrodes on a curvature adjustment base layer, each second electrode located in a respective one of a plurality of sub-regions; forming a sealing wall and a plurality of separating walls in a region surrounded by the sealing wall on the non-light exit surface of the flexible display component layer on which the plurality of first electrodes have been formed or on the curvature adjustment base layer on which the plurality of second electrodes have been formed, so as to form a plurality of accommodation spaces; filling electrorheological fluid in each liquid accommodation space; aligning the curvature adjustment base layer and the flexible display component layer, so that an orthographic projection of each sub-region on the flexible display component layer overlaps with a respective one of the plurality of the sub-pixel regions; and sealing the curvature adjustment base layer and the flexible display component layer. A second electrode, a corresponding first electrode, and electrorheological fluid between the second electrode and the first electrode form a curvature adjustment unit, and electrorheological fluid of every two adjacent curvature adjustment units are separated by at least one separating wall.

In some embodiments, forming the plurality of first electrodes on the non-light exit surface of the flexible display component layer, includes: depositing a first conductive layer on the non-light exit surface of the flexible display component layer; and etching the first conductive layer to so form the plurality of first electrodes spaced apart from each other. Forming the plurality of second electrodes on the curvature adjustment base layer, includes: depositing a second conductive layer on the curvature adjustment base layer, a portion of the second conductive layer located in each sub-region serving as a second electrode.

In some embodiments, forming the plurality of first electrodes on the non-light exit surface of the flexible display component layer, includes: depositing a first conductive layer on the non-light exit surface of the flexible display component layer, a portion of the first conductive layer located in each sub-pixel region serving as a first electrode. Forming the plurality of second electrodes on the curvature adjustment base layer, includes: depositing a second conductive layer on the curvature adjustment base layer; and etching the second conductive layer to form the plurality of second electrodes spaced apart from each other.

In some embodiments, if the sealing wall and the plurality of separating walls are formed on the non-light exit surface of the flexible display component layer, forming a sealing wall and a plurality of separating walls on the non-light exit surface of the flexible display component layer, includes: forming the sealing wall and the plurality of separating walls on the non-light exit surface of the flexible display component layer by using a sealant material. If the sealing wall and the plurality of separating walls are formed on the curvature adjustment base layer, forming a sealing wall and a plurality of separating walls on the curvature adjustment base layer, includes: forming the sealing wall and the plurality of separating walls on the curvature adjustment base layer with a sealant material.

In some embodiments, forming the curvature adjustment layer further includes: forming a plurality of first lead wires on the non-light exit surface of the flexible display component layer, wherein one of the plurality of first lead wires is electrically connected to a first electrode of a corresponding curvature adjustment unit; and forming a plurality of second lead wires on the curvature adjustment base layer, wherein one of the plurality of second lead wires is electrically connected to a second electrode of the corresponding curvature adjustment unit. Or, forming the curvature adjustment layer further includes: forming at least one first lead wire on the non-light exit surface of the flexible display component layer, wherein the at least one first lead wire is electrically connected to the plurality of first electrodes that are integrally formed; and forming a plurality of second lead wires on the curvature adjustment base layer, wherein one of the plurality of second lead wires is electrically connected to a second electrode of a corresponding curvature adjustment unit. Or, forming the curvature adjustment layer further includes: forming a plurality of first lead wires on the non-light exit surface of the flexible display component layer, wherein one of the plurality of first lead wires is electrically connected to a first electrode of a corresponding curvature adjustment unit; and forming at least one second lead wire on the curvature adjustment base layer, wherein the at least one second lead wire is electrically connected to the plurality of second electrodes that are integrally formed.

In the third aspect, provided is a method of controlling the virtual display apparatus. The virtual display apparatus further includes a controller. The method includes: receiving, by the controller, image data of an image to be displayed by the flexible display component layer; obtaining, by the controller, at least one deformation signal according to the image data; sending, by the controller, the at least one deformation signal to the curvature adjustment layer in response to receiving an adjustment signal, so that the curvature adjustment layer deforms in response to the at least one deformation signal to adjust distances between the first surface of the lens layer and different positions of the light exit surface of the flexible display component layer along the thickness direction of the lens layer.

In some embodiments, the curvature adjustment layer includes a plurality of curvature adjustment units, and each curvature adjustment unit includes a first electrode and a second electrode that are disposed oppositely, and an electrorheological fluid located between the first electrode and the second electrode. Obtaining, by the controller, the at least one deformation signal according to the image data, includes: obtaining, by the controller, voltage signals according to the image data. Sending, by the controller, the at least one deformation signal to the curvature adjustment layer in response to an adjustment signal, so that the curvature adjustment layer deforms in response to the deformation signal, includes: sending, by the controller, the voltage signals to first electrodes and second electrodes of the plurality of curvature adjustment units in response to the adjustment signal, so as to adjust a state of the electrorheological fluid of each curvature adjustment unit.

In some embodiments, obtaining, by the controller, voltage signals according to the image data, includes: processing, by the controller, the image data by using a deep neural network model, to determine values of voltages to be applied to a first electrode and a second electrode of each curvature adjustment unit.

In some embodiments, the image data includes feature vectors of a plurality of sub-pixel images, each feature vector includes N color dimensions and one depth-of-field dimension, and N is a number of colors of sub-pixels in the flexible display component layer. Processing, by the controller, the image data by using the deep neural network model to determine values of voltages to be applied to the first electrode and the second electrode of each curvature adjustment unit, includes: processing, by the controller, the feature vectors of the plurality of sub-pixel images by using the deep neural network model to determine the values of voltages to be applied to the first electrode and the second electrode of the curvature adjustment unit corresponding to each sub-pixel image.

BRIEF DESCRIPTION OF THE DRAWINGS

In order to describe technical solutions in embodiments of the present disclosure more clearly, the accompanying drawings to be used in the description of embodiments will be introduced briefly. However, the accompanying drawings to be described below are merely some embodiments of the present disclosure, and a person of ordinary skill in the art can obtain other drawings according to those drawings without paying any creative effort. In addition, the accompanying drawings described below may be regarded as schematic diagrams, but are not limitations on an actual size of a product, an actual process of a method, an actual timing of signals that the embodiments of the present disclosure relate to.

FIG. 11 is a flow chart of a method of forming a curvature adjustment layer of a virtual display apparatus, in accordance with some embodiments;

FIG. 12 is a flow chart of a method of forming first electrodes, in accordance with some embodiments;

FIGS. 13A and 13B are diagrams showing a process of forming first electrodes, in accordance with some embodiments;

FIG. 14 is a flow chart of a method of forming second electrodes, in accordance with some embodiments;

FIGS. 15A and 15B are diagrams of a process of forming second electrodes, in accordance with some embodiments;

FIG. 16 is a flow chart of another method of manufacturing a virtual display apparatus, in accordance with some embodiments;

DETAILED DESCRIPTION

Figure 1:
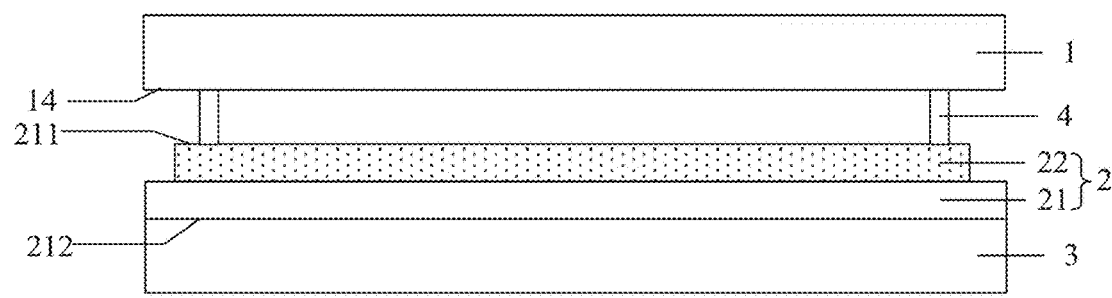
FIG. 1 is a schematic diagram of a virtual display apparatus, in accordance with some embodiments.

Technical solutions in some embodiments of the present disclosure will be described below clearly and completely with reference to the accompanying drawings. Obviously, the embodiments described herein are merely some but not all the embodiments of the present disclosure. All other embodiments obtained on a basis of the embodiments of the present disclosure by a person of ordinary skill in the art shall be included in the protection scope of the present disclosure.

Any person skilled in the art may understand that, unless otherwise defined, all the terms used herein (including technical terms and scientific terms) have the same meanings as the general understanding of a person of ordinary skill in the art which the application belongs to. It should also be understood that terms such as those defined in an ordinary dictionary should be interpreted as have meanings consistent with their meanings in the context of the related art, and should not interpreted in an idealized or extremely formalized way unless explicitly defined herein.

Unless the context requires otherwise, the term "comprise/include" and other forms thereof such as the third-person singular form "comprises/includes" and the present participle form "comprising/including" in the description and the claims are construed as open and inclusive, i.e., "inclusive, but not limited to". In the description, the terms such as "one embodiment", "some embodiments", "exemplary embodiments", "example", "some examples", or "specific example" are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

In the description of some embodiments, the terms such as "connected" and its extensions may be used. For example, the term "connected" may be used in description of some embodiments to indicate that two or more components are in direct physical or electrical contact with each other. The term "connected", however, may also mean that two or more elements are not in direct contact with each other, but yet still co-operate or interact with each other. The embodiments disclosed herein are not necessarily limited in this context.

Hereinafter, the terms "first" and "second" are merely used for describing purpose, but cannot be construed as indicating or implying relative importance or implicitly indicating the number of the indicated technical features below. Thus, features defined by "first" and "second" may explicitly or implicitly include one or more of the features. In the description of the embodiments of the present disclosure, "a plurality of" means two or more unless otherwise specified.

At present, if a VR/AR display apparatus is to display a 3D image, the VR/AR display apparatus usually generates a left-eye image and a right-eye image based on the 3D image, and then emits light that forms the two images. The light usually does not carry depth information, and the depth sense is obtained by the following manner. After the left-eye image and the right-eye image reach the eyes, the visual cortex of the brain will fuse them into a perception of a 3D sense with the depth sense. However, since the left-eye image and the right-eye image do not actually contain the depth information, the focus of the user's eyes still maintains a fixed value, resulting in that the focus of the eyes cannot be effectively matched with the depth sense of the image. In this case, visual convergence adjustment conflict may occur.

In order to improve this defect, spherical lenses may be provided in the VR/AR display apparatus to adjust depth-of-field information of the image. However, spherical lens technology is easy to produce spherical aberration, which may cause more serious dizziness. In addition, adjustment of the spherical lenses is generally achieved by a mechanical method (for example, the spherical lens is of an adjustable and elastic lens structure and curvature of the spherical lenses is adjusted by a hydraulic system), and the adjustment speed of the mechanical method is in seconds. However, the image refresh speed may be in milliseconds, and thus the mechanical method is difficult to make the display apparatus to display images smoothly.

Some embodiments of the present disclosure provide a virtual display apparatus. As shown in FIG. 1, the virtual display apparatus includes a lens layer 1, a flexible display component layer 2 and a curvature adjustment layer 3.

Figure 3:
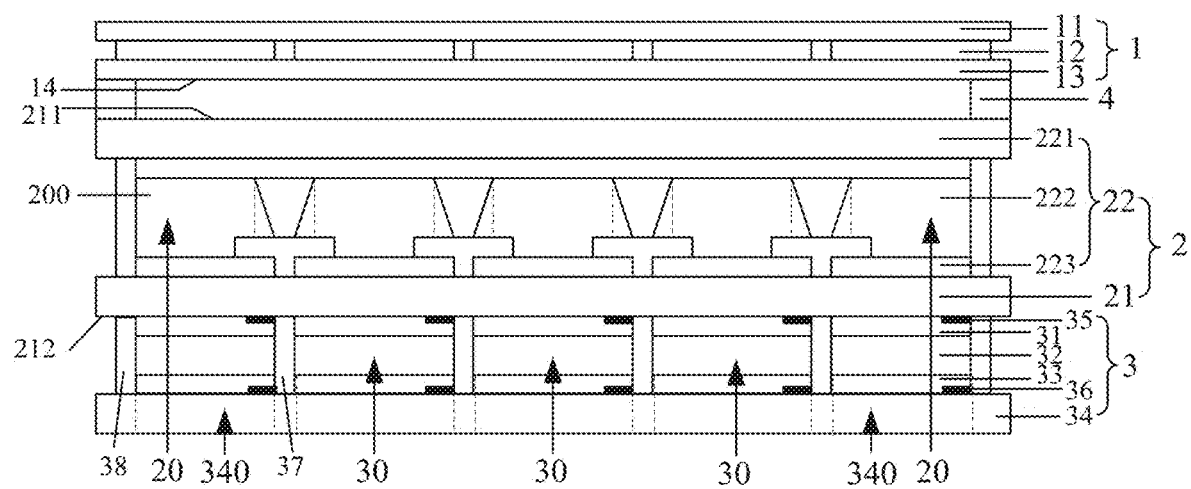
FIG. 3 is a schematic diagram of yet another virtual display apparatus, in accordance with some embodiments.

As shown in FIGS. 1 and 3, the flexible display component layer 2 has a light exit surface 211 and a non-light exit surface 212 opposite to the light exit surface 211. The flexible display component layer 2 is configured to emit light. The light exit surface 211 is a surface via which the light exits from the flexible display component layer.

The lens layer 1 is disposed at the light exit surface 211 of the flexible display component layer 2. The lens layer 1 is configured to converge the light emitted by the flexible display component layer 2. The lens layer 1 has a first surface 14 facing the flexible display component layer 2, and the first surface 14 of the lens layer 1 and the light exit surface 211 of the flexible display component layer 2 have a gap therebetween.

The curvature adjustment layer 3 is disposed on the non-light exit surface 212 of the flexible display component layer 2, that is, the curvature adjustment layer 3 is in contact with the first flexible base layer 21. The curvature adjustment layer 3 is configured to deform in response to at least one deformation signal, so as to adjust distances between the first surface 14 of the lens layer 1 and different positions of the light exit surface 211 of the flexible display component layer 2 along a thickness direction of the lens layer 1.

For example, as shown in FIG. 1, the virtual display apparatus further includes a frame sealant 4 that is located between the lens layer 1 and the flexible display component layer 2 and located at edges of the lens layer 1 and the flexible display component layer 2, so as to bond and fix the lens layer 1 and the flexible display component layer 2 together. A thickness of the frame sealant 4 in the thickness direction of the lens layer 1 is determined according to a dimension of the gap between the lens layer 1 and the flexible display component layer 2 in the thickness direction of the lens layer 1. When a user uses the virtual display apparatus, the lens layer 1 is closer to the user's eyes than the curvature adjustment layer 3.

In the virtual display apparatus, the curvature adjustment layer 3 is disposed on the non-light exit surface 212 of the flexible display component layer 2, and the curvature adjustment layer 3 deforms in response to the at least one deformation signal, so that the flexible display component layer 2 may deform along with the curvature adjustment layer 3 to adjust the distances between the first surface 14 of the lens layer 1 and different positions of the light exit surface 211 of the flexible display component layer 2 in the thickness direction of the lens layer 1. Since the distances between the first surface 14 of the lens layer 1 and different positions of the light exit surface 211 of the flexible display component layer 2 will affect the depth-of-field information of the image to be displayed by the virtual display apparatus, that is, in a case where the distances between the first surface 14 of the lens layer 1 and different positions of the light exit surface 211 of the flexible display component layer 2 are not completely the same, the image displayed by the virtual display apparatus has different depth-of-field information. Therefore, the depth-of-field information of the image displayed by the virtual display apparatus may be adjusted by controlling the deformation state of the curvature adjustment layer 3.

Figure 2:
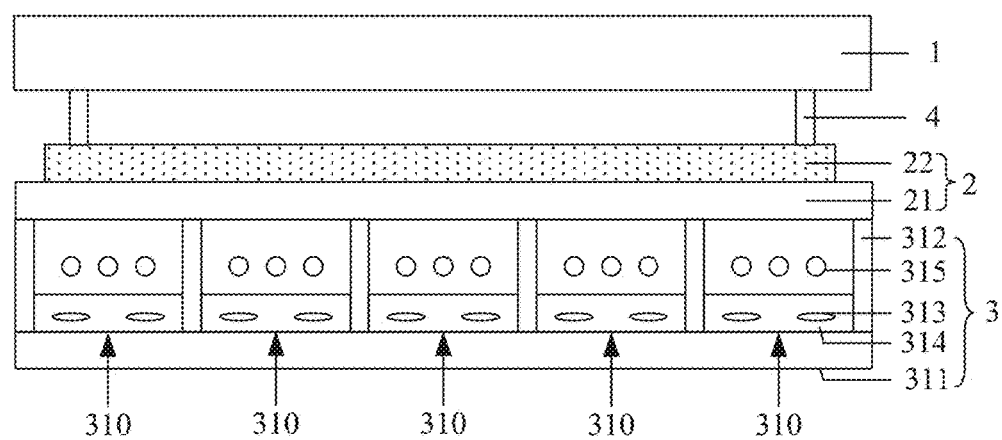
FIG. 2 is a schematic diagram of another virtual display apparatus, in accordance with some embodiments.

In some embodiments, as shown in FIG. 2, the curvature adjustment layer 3 includes a base layer 311, and a plurality of magnetic field generating units 310 and a plurality of magnetic separating walls 312 that are disposed between the base layer 311 and the flexible display component layer 2. Every two adjacent magnetic field generating units 310 are separated by a magnetic separating wall 312. Each magnetic field generating unit 310 includes an encapsulation layer 314 disposed on a surface of the base layer 311 facing the flexible display component layer 2, and magnetorheological fluid 315 disposed between the encapsulation layer 314 and the flexible display component layer 2. The magnetic field generating unit 310 further includes a coil 313 encapsulated in the encapsulation layer 314.

In this case, the virtual display apparatus further includes two lead wires, i.e., a first lead wire and a second lead wire, for each magnetic field generating unit 310, one terminal of the first lead wire and one terminal of the second lead wire is electrically connected to two terminals of the coil 313, and the other terminals of the first and second lead wires are connected to two terminals of a series structure composed of a power supply and a current modulator. In addition, the current regulator is connected to a controller.

The controller is configured to provide a current signal to the current modulator, and the current regulator is configured to change and provide the current to the coil 313, so as to change magnetic field intensity around the coil 313. Since the state of the magnetorheological fluid 315 changes with the magnetic field intensity, the deformation state of the curvature adjustment layer 3 is adjusted by controlling the magnetic field intensity. As a result, the distances between the first surface 14 of the lens layer 1 and different positions of the light exit surface 211 of the flexible display component layer 2 in the thickness direction of the lens layer 1 are adjusted. Herein, the current signal is the deformation signal.

Of course, the magnetic field generating unit 310 may also have other structures. The above structure is merely an illustration, but not a limitation to the magnetic field generating unit 301.

Figure 7:
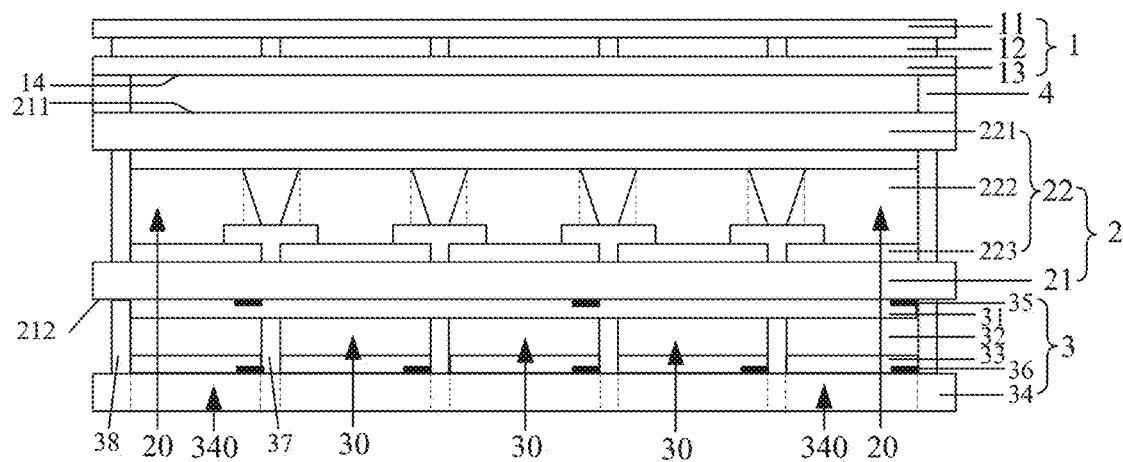
FIG. 7 is a schematic diagram of yet another virtual display apparatus, in accordance with some embodiments.
Figure 8:
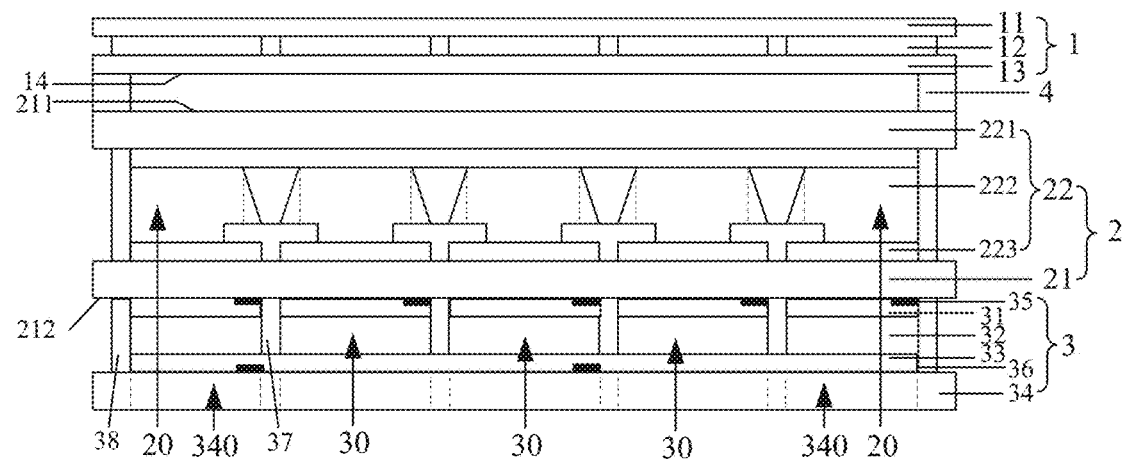
FIG. 8 is a schematic diagram of yet another virtual display apparatus, in accordance with some embodiments.

In some other embodiments, as shown in FIGS. 3, 7 and 8, the curvature adjustment layer 3 includes a curvature adjustment base layer 34, and a sealing wall 38, a plurality of curvature adjustment units 30 and a plurality of separating walls 37 that are disposed between the curvature adjustment base layer 34 and the flexible display component layer 2. The sealing wall 38 may be located at edges of the curvature adjustment base layer 34 and the flexible display component layer 2. The sealing wall 38, the curvature adjustment base layer 34 and the flexible display component layer 2 together form a cavity. The plurality of curvature adjustment units 30 and the plurality of separating walls 37 are located in the cavity. Each curvature adjustment unit 30 includes a first electrode 31 and a second electrode 33 that are disposed oppositely along the thickness direction of the lens layer 1, and electrorheological fluid 32 located between the first electrode 31 and the second electrode 33. Electrorheological fluid 32 of every two adjacent curvature adjustment units 30 is separated by at least one separating wall 37.

In some embodiments, as shown in FIGS. 3, 7 and 8, all first electrodes 31 are disposed on the non-light exit surface 212 of the flexible display component layer 2, and all second electrodes 33 are disposed on a surface of the curvature adjustment base layer 34 facing the flexible display component layer 2. Thus, the non-light exit surface 212 of the flexible display component layer 2 is directly used to carry the first electrodes 31, thereby reducing resistance of driving the flexible display component layer 2 by the curvature adjustment layer 3 to deform, and simplifying the manufacturing process.

In this case, the arrangements of all the first electrodes 31 and all the second electrodes 33 and the position of the plurality of separating walls 37 may be as follows.

For example, as shown in FIG. 3, all the first electrodes 31 are spaced apart from each other, and all the second electrodes 33 are spaced apart from each other. In this case, the plurality of separating walls 37 may be disposed between the curvature adjustment base layer 34 and the flexible display component layer 2 to separate electrorheological fluid 32 of every two adjacent curvature adjustment units 30.

For another example, as shown in FIG. 7, all the first electrodes 31 are integrally formed, and all the second electrodes 33 are spaced apart from each other. In this case, the plurality of separating walls 37 may be disposed between the curvature adjustment base layer 34 and the first electrodes that are integrally formed, so as to separate electrorheological fluid 32 of every two adjacent curvature adjustment units 30.

For another example, as shown in FIG. 8, all the first electrodes are spaced apart from each other, and all the second electrodes are integrally formed. In this case, the plurality of separating walls 37 may be disposed between the second electrodes that are integrally formed and the flexible display component layer 2 to separate electrorheological fluid 32 of every two adjacent curvature adjustment units 30.

In some examples, a material of the sealing wall 38 and the plurality of separating walls 37 may include or may be a sealant. In this way, a process for forming the curvature adjustment layer 3 may be simplified.

For example, the first electrode 31 and the second electrode 33 of the curvature adjustment unit 30 constitute an electrode pair. A material of the first electrode 31 and the second electrode 33 may be a transparent conductive material, such as indium tin oxide (ITO).

In some other embodiments, the curvature adjustment layer 3 further includes a flexible base disposed on the non-light exit surface 212 of the flexible display component layer 2, and the plurality of curvature adjustment units 30 and the plurality of separating walls 37 are disposed between the flexible base and the curvature adjustment base layer 34. In this case, the first electrode 31 may be disposed on a surface of the flexible base facing the curvature adjustment base layer 34, and the second electrode 33 is disposed on the surface of curvature adjustment base layer 34 facing the flexible display component layer 2. The flexible base of the curvature adjustment layer 3 is, for example, adhered to the flexible display component layer 2.

The electrorheological fluid 32 is, for example, mixed liquid including base liquid with high insulativity and polarizable dielectric particles suspended in the base liquid. As for the curvature adjustment unit 30, in a case where an electric field intensity between the first electrode 31 and the second electrode 33 is much less than a certain critical value, the electrorheological fluid 32 is in a liquid state, and the volume of the curvature adjusting unit 30 is large. In a case where the electric field intensity between the first electrode 31 and the second electrode 33 is much greater than the certain critical value, the electrorheological fluid 32 is in a solid state, and the volume of the curvature adjustment unit 30 is small.

Figure 4:
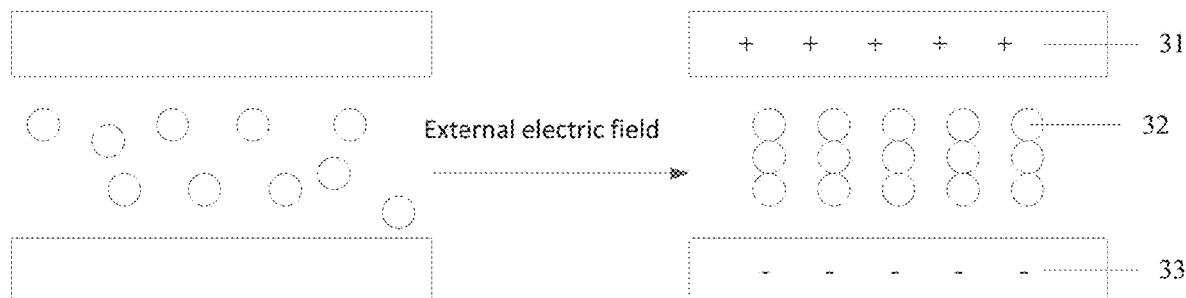
FIG. 4 is a diagram showing a liquid-solid conversion principle of electrorheological fluid, in accordance with some embodiments.

FIG. 4 is a schematic diagram showing a liquid-solid conversion principle of the electrorheological fluid 32. When voltages are not applied to the first electrode 21 and the second electrode 33, that is, an electric field does not exist between the first electrode 21 and the second electrode 33, the dielectric particles are distributed in the base liquid randomly, and the electrorheological fluid 32 is similar to the common Newton fluid. When voltages are applied to the first electrode 21 and the second electrode 33, dielectric particles are polarized instantaneously into electric dipoles, and interaction between the dielectric particles causes the dielectric particles to form a chain and then form a column-shaped structure, thereby forming solid.

Since the electrorheological fluid 32 is in a fluid state when the voltages are not applied, one or more separating walls 37 are provided between every two adjacent curvature adjusting units 30. In this way, the separating walls 37 connected end to end, and the electrode pair of the curvature adjustment unit 30 together form an enclosed liquid accommodation space, and the electrorheological fluid 32 is filled in the liquid accommodation space. As for each curvature adjustment unit 30 at edges of the curvature adjustment layer 3, at least one portion of the sealing wall 38 serves as at least one separating wall 37 for enclosing the electrorheological fluid 32 in the curvature adjustment unit 30. The electrorheological fluid 32 of different curvature adjustment units 30 are separated, so that mutual interference between the adjacent curvature adjusting units 30 is avoided, and the state of the electrorheological fluid 32 of each curvature adjustment unit 30 is controlled only by the electric field formed between the electrode pair of the curvature adjustment unit 30.

Since the electrorheological fluid 32 may achieve continuous, reversible and controllable changes under the control of the electric field formed between the electrode pair of the curvature adjustment unit 30, the state of the electrorheological fluid 32 is controlled by the electric field. On this basis, the deform state of the curvature adjustment layer 3 may be controlled by controlling the state of the curvature adjustment unit 30, and thus a bending state of the flexible display component layer 2 in contact with the curvature adjustment layer 3 is controlled. Therefore, distances between the first surface 14 of the lens layer 1 and different positions of the light exit surface 211 of the flexible display component layer 2 are adjusted. In addition, the liquid-solid conversion speed of the electrorheological fluid 32 is in milliseconds and is equivalent to the image refresh speed, and thus the display apparatus may display images smoothly.

It will be noted that, the curvature adjustment unit 30 may include the electrorheological fluid or the magnetorheological fluid, but the material is not limited thereto, as long as the material can deform based on specific conditions.

In some embodiments, the flexible display component layer 2 is a flexible organic light-emitting diode (OLED) display panel or a flexible quantum dot light-emitting diode (QLED) display panel.

In an example where the flexible display component layer 2 is the flexible OLED display panel, as shown in FIG. 3, the flexible display component layer 2 includes a first flexible base layer 21 and a multi-layer structure 22 stacked along the thickness direction of the lens layer 1, and the multi-layer structure 22 is closer to the lens layer 1 than the multi-layer structure 22. A surface of the multi-layer structure 22 farthest away from the first flexible base layer 21 is the light exit surface 211. The multi-layer structure 22 includes a thin film transistor layer 223, a light-emitting functional layer 222 and a second flexible base layer 221 that are sequentially stacked along the thickness direction of the lens layer 1. The second flexible base layer 221 is disposed at a side of the light-emitting functional layer 222 proximate to the lens layer 1, and the thin film transistor layer 223 is disposed at another side of the light-emitting functional layer 222 proximate to the first flexible base layer 21. The second flexible base layer 221 is used for encapsulating the light-emitting functional layer 222 to protect the light-emitting functional layer 222.

As shown in FIG. 3, the flexible display component layer 2 includes a plurality of sub-pixel 200, and a region where the sub-pixel 200 is located is a sub-pixel region 20. In some examples, the light-emitting functional layer 222 includes a plurality of light-emitting devices, and each light-emitting device is located in a corresponding sub-pixel region 20. The thin film transistor layer 223 includes pixel driving circuits, each sub-pixel region 20 is also provided with a pixel driving circuit connected to the light-emitting device, and the pixel driving circuit includes at least two thin film transistors. The pixel driving circuit is used for driving the light-emitting device to emit light, so that the flexible display component layer 2 realizes image display. For example, the plurality of light-emitting devices includes light-emitting devices for emitting red light, light-emitting devices for emitting green light, or light-emitting devices for emitting blue light.

In some embodiments, as shown in FIG. 3, an orthographic projection of each curvature adjustment unit 30 on the flexible display component layer 2 overlaps with a corresponding sub-pixel region 20. That is, an orthographic projection of the electrode pair of the curvature adjustment unit 30 overlaps with the corresponding sub-pixel region 20.

The image displayed by the flexible display component layer 2 includes a plurality of sub-pixel images, each sub-pixel image is represented by light emitted by the corresponding sub-pixel 200, and depth-of-field information corresponding to different sub-pixel images in the image may be different.

Figure 5:
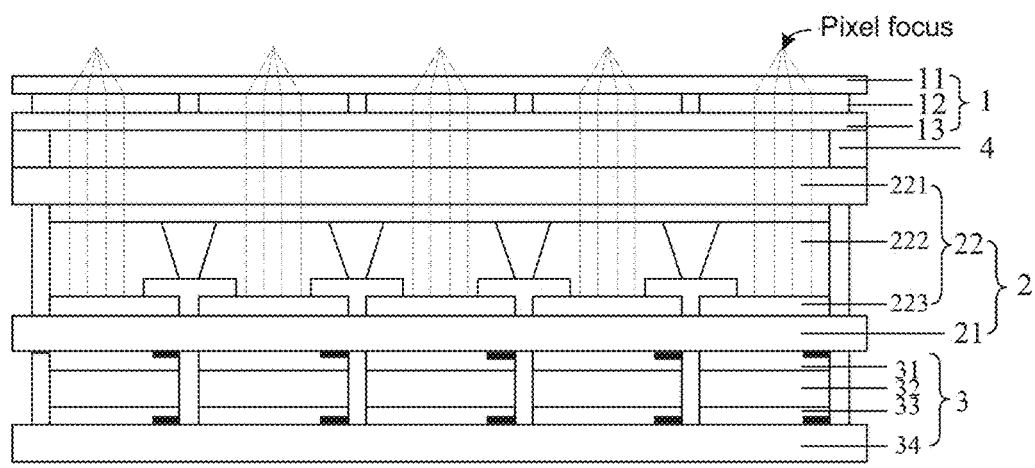
FIG. 5 is a diagram showing focus positions of sub-pixels when a virtual display apparatus is in an initial state, in accordance with some embodiments.

When voltages are not applied to the electrode pair of each curvature adjustment unit 30 of the curvature adjustment layer 3, the curvature adjustment layer 3 is in an initial state, and the flexible display component layer 2 is in a planar state. In this case, as shown in FIG. 5 (a pixel focus in FIG. 5 refers to a focus of light emitted by the sub-pixel), the distance between the light exit surface 211 of the flexible display component layer 2 and the first surface 14 of the lens layer 1 is uniform, and focuses of the light emitted by all the sub-pixels 200 are located in the same plane. Therefore, the image displayed by the flexible display component layer 2 does not contain the depth-of-field information.

Figure 6:
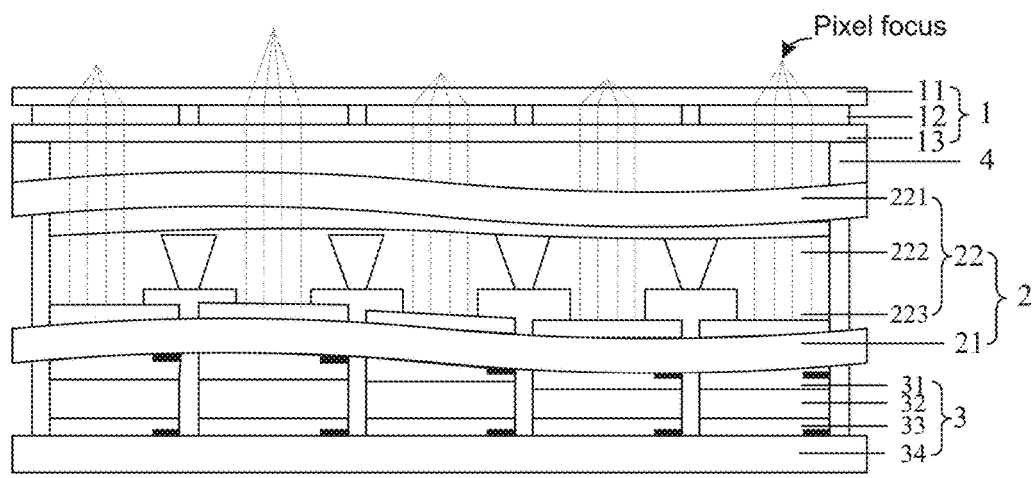
FIG. 6 is a diagram showing focus positions of sub-pixels when a virtual display apparatus is in a power-up state, in accordance with some embodiments.

When voltages are applied to the electrode pair of each curvature adjustment unit 30 of the curvature adjustment layer 3, the curvature adjustment layer 3 deforms, and the flexible display component layer 2 is in a non-planar state. In this case, as shown in FIG. 6 (a pixel focus in FIG. 6 refers to a focus of light emitted by the sub-pixel), the distances between the first surface 14 of the lens layer 1 and different positions of the light exit surface 211 of the flexible display component layer 2 in the thickness of the lens layer 1 are not completely the same, and focuses of light emitted by all sub-pixels 200 are located in different planes.

The plurality of curvature adjustment units 30 are in one-to-one correspondence with the plurality of sub-pixel regions 20, and the focus of the light emitted by each sub-pixel 200 is independently adjustable, so that each sub-pixel image may present respective depth-of-field information.

The state of the electrorheological fluid 32 between the electrode pair is adjusted by applying voltages to the electrode pair, and the distances between the first surface 14 of the lens layer and different positions of the light exit surface 211 of the flexible display component layer 2 in the thickness direction of the lens layer 1 are adjusted, so that the depth-of-field of each sub-pixel image in the image displayed by the flexible display component layer 2 is adjusted. In this way, the accuracy of adjusting the depth-of-field of the image displayed by the flexible display component layer 2 may be improved.

Of course, the orthographic projection of the curvature adjustment unit 30 may be located in part of sub-pixel regions 20 of the plurality of sub-pixel regions 20. For example, the curvature adjustment unit 30 corresponds to m×m sub-pixel regions 20 arranged in a matrix, m is an integer greater than or equal to 2.

In some embodiments, as shown in FIG. 3, the curvature adjustment layer 3 further includes a plurality of first lead wires 35 disposed at a side of the flexible display component layer 2 proximate to the curvature adjustment base layer 34, and a plurality of second lead wires 36 disposed at a side of the curvature adjustment base layer 34 proximate to the flexible display component layer 2. One of the plurality of first lead wires 35 is electrically connected to a first electrode 31 of a corresponding curvature adjustment unit 30, and one of the second lead wires 36 is electrically connected to a second electrode 33 of the corresponding curvature adjustment unit 30. In this case, the number of the first electrodes 31, the second electrodes 33, the first lead wires 35 and the second lead wires 36 are the same.

In this way, each first lead wire 35 may transmit a voltage to a corresponding first electrode 31, and each second lead wire 36 may transmit a voltage to a corresponding second electrode 33.

In some other embodiments, as shown in FIG. 7, all the first electrodes 31 are integrally formed, that is, all the first electrodes 31 constitute an entire plate-shaped electrode. In this case, the curvature adjustment layer 3 further includes, for example, at least one first lead wire 35 disposed at a side of the flexible display component layer 2 proximate to the curvature adjustment base layer 34, and a plurality of second lead wires 36 disposed at a side of the curvature adjustment base layer 34 proximate to the flexible display component layer 2. The at least one first lead wire 35 is electrically connected to the first electrodes 31 having the integrated structure, and one of the plurality of second lead wires 36 is electrically connected to a second electrode 33 of a corresponding curvature adjustment unit 30. In this case, the number of the second electrodes 33 is equal to the number of the second lead wires 36.

In this way, the at least one first lead wire 35 may transmit a voltage to the first electrodes 31 having the integrated structure, and each second lead wire 36 may transmit a voltage to a corresponding second electrode 33. In addition, in a case where the at least one first lead wire 35 includes a plurality of first lead wires 35, voltage drop generated at different positions of the first electrodes 31 having the integrated structure may be improved.

In some other embodiments, as shown in FIG. 8, all the second electrodes are integrally formed, that is, all the second electrodes constitute an entire plate-shaped electrode. In this case, the curvature adjustment layer 3 further includes a plurality of first lead wires 35 disposed at a side of the flexible display component layer 2 proximate to the curvature adjustment base layer 34, and at least one second lead wire 36 disposed at a side of the curvature adjustment base layer 34 proximate to the flexible display component layer 2. The at least one second lead wire 36 is electrically connected to the second electrodes 33 having the integrated structure, and one of the plurality of first lead wires 35 is electrically connected to a first electrode 31 of a corresponding curvature adjustment unit 30. In this case, the number of the first electrodes 31 is equal to the number of the first lead wires 35.

In this way, each first lead wire 35 may transmit a voltage to a corresponding first electrode 31, and the at least one second lead wire 36 may transmit a voltage to the second electrodes 33 having the integrated structure. In addition, in a case where the at least one second lead wire 36 includes a plurality of the second lead wires 36, voltage drop generated at different positions of the second electrodes 33 having the integrated structure may be improved.

It will be noted that, the first lead wire 35 may be disposed on the non-light exit surface 212 of the flexible display component layer 2, and is in contact with the non-light exit surface 212 of the flexible display component layer 2. Or, other first layer(s) may be provided on the non-light exit surface 212 of the flexible display component layer 2, and the first lead wire 35 is disposed on a surface of the other first layer(s) farthest away from the flexible display component layer 2. The second lead wire 36 may be disposed on the surface of the curvature adjustment base layer 34 facing the flexible display component layer 2, and is in contact with the surface. Or, other second layer(s) may be provided on the surface of the curvature adjustment base layer 34 facing the flexible display component layer 2, and the second lead wire 35 is disposed on a surface of the other second layer(s) farthest away from the curvature adjustment base layer 34.

Figure 9:
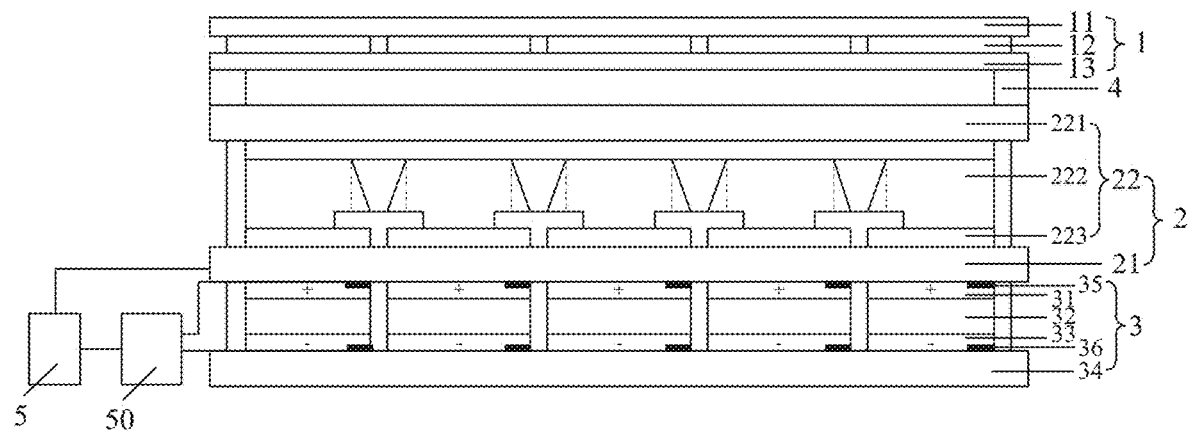
FIG. 9 is a schematic diagram of yet another virtual display apparatus, in accordance with some embodiments.

In some embodiments, as shown in FIG. 9, the virtual display apparatus further includes a processor 5 and a controller 50 connected to the processor 5. The processor 5 and the controller 50 may be disposed on a printed circuit board. All the first lead wires 35 and all the second lead wires 36 are electrically connected to the controller 50. The controller 50 is configured to receive image data of an image to be displayed by the flexible display component layer 2, obtain at least one deformation signal according to the image data, and send the at least one deformation signal to the curvature adjustment layer 3 in response to receiving an adjustment signal. The processor 5 is configured to sends the adjustment signal in response to receiving the image data. The at least one deformation signal includes voltage signals, and the controller 50 is further configured to provide the voltage signals to a first electrode 31 and a second electrode 33 of each curvature adjustment unit 30 of the curvature adjustment layer 3, respectively.

In some embodiments, the controller 50 includes a storage medium pre-storing the image data of the image to be displayed by the virtual display apparatus (the image data of the image to be displayed includes the depth-of-field information of all the sub-pixel images of the image to be displayed), and values of voltages to be applied to the electrode pair of the curvature adjustment layer 3 corresponding to the image data of the image to be displayed. In this way, in the process of displaying the image by the virtual display apparatus, after the controller 50 receives the adjustment signal, the controller 50 adjusts the voltages actually applied to the electrode pair of the curvature adjusting layer according to the pre-stored values of voltages to be applied to the electrode pair corresponding to the image data of the image to be displayed.

In some other embodiments, the controller 50 includes a storage medium pre-storing the image data of the image to be displayed by the virtual display apparatus (the image data of the image to be displayed includes the depth-of-field information of all the sub-pixel images of the image to be displayed), and a correspondence between the depth-of-field information and voltage values of each electrode pair. In this way, in the process of displaying the image by the virtual display apparatus, after receiving the adjustment signal, the controller 50 determines values of the voltages to be applied to the electrode pair of the curvature adjustment layer 3 according to the pre-stored depth-of-field information of each sub-pixel image and the pre-stored correspondence between the depth-of-field information and the voltage values of the electrode pair, and adjusts the voltages actually to be applied to the electrode pair.

The correspondence between the depth-of-field information and the voltage values of the electrode pair is stored in the storage medium of the controller 50, so that the voltage values to be applied to the electrode pair are determined according to the depth-of-field information of all the sub-pixel images of the image to be displayed, and the adaptability of the virtual display apparatus may be improved.

In some other embodiments, the controller 50 may also obtain the values of voltages to be applied to the electrode pair of the curvature adjustment layer 3 by using a deep neural network model.

In some embodiments, the virtual display apparatus further includes a driver electrically connected to the controller 50, and the driver is used for driving the flexible display component layer 2 to emit light. The controller 50 is further configured to obtain the image data of the image to be displayed from the driver. For example, the driver includes a plurality of integrated circuits (IC).

The image data of the image to be displayed, which includes depth-of-field information of all the sub-pixel images of the image to be displayed, from the driver. In this case, the controller 50 determines values of the voltages to be applied to the electrode pair of each curvature adjustment unit 30 according to the depth-of-field information of all the sub-pixel images, and adjusts and provides the voltages to the electrode pair according to the determined voltage values. The controller 50 may obtain the depth-of-field information of all the sub-pixel images of the image to be displayed by the flexible display component layer 2, so that the voltages applied to the electrode pair may be adjusted in real time, and thus the applicability of the virtual display apparatus may be further improved.

In another embodiment, the controller 50 obtains the image data of the image to be displayed, which includes color information and depth-of-field information of all the sub-pixel images of the image to be displayed, from the driver. In this case, the controller 50 may adjust and provide voltages to the electrode pair of each curvature adjustment unit 30 to adjust the depth-of-field of the sub-pixel image of the image displayed by the flexible display component layer 2, and also adjust and provide voltages to the pixel driving circuit of the light-emitting device of each sub-pixel to adjust the light-emitting degree of the sub-pixel, so that clear and three-dimensional display effect of the image may be achieved.

Since light with different wavelengths has different propagation speed in the same material, for example, red light passes through glass faster than blue light, resulting in chromatic aberration and image distortion when two kinds of light passes through a same lens.

In some embodiments, the lens layer 1 is a planar metalens. The planar metalens is capable of adjusting delay for light with different wavelengths to different degrees, so as to control the speed of the light with different wavelengths passing therethrough. In this way, the light with different wavelengths may have a focus after passing through the planar metalens, and thus chromatic aberration may be eliminated.

For example, as shown in FIG. 3, the planar metalens includes an upper protective layer 11, a planar metalens body layer 12 and a lower protective layer 13, and a material of the planar metalens body layer 12 includes a titanium dioxide nanometer material.

The process of forming the planar metalens includes: depositing a titanium dioxide film on the lower protective layer 13; coating a photoresist layer on the titanium dioxide film; performing exposure, developing and etching processes to obtain titanium dioxide nanometer columns arranged in an array, which constitute the planar metalens body layer 1; and forming the upper protective layer 11 on the planar metalens body layer 1.

In some embodiments, the virtual display apparatus is a VR/AR display apparatus. In this case, in addition to the lens layer 1, the flexible display component layer 2 and the curvature adjustment layer 3, the virtual display apparatus further includes auxiliary components, such as a frame for matching with the user. The lens layer 1, the flexible display component layer 2 and the curvature adjustment layer 3 are disposed sequentially at a side of the frame, the lens layer 1 is located at a side of the flexible display component layer 2 proximate to the frame, and the lens layer 1 is fixed to the frame. Of course, the virtual display apparatus may further include a casing used for protecting the lens layer 1, the flexible display component layer 2 and the curvature adjustment layer 3. When the user uses the VR/AR display apparatus, the user's eyes are near the frame, and the image displayed by the flexible display component layer 2 may be viewed through the lens layer 1.

Figure 10:
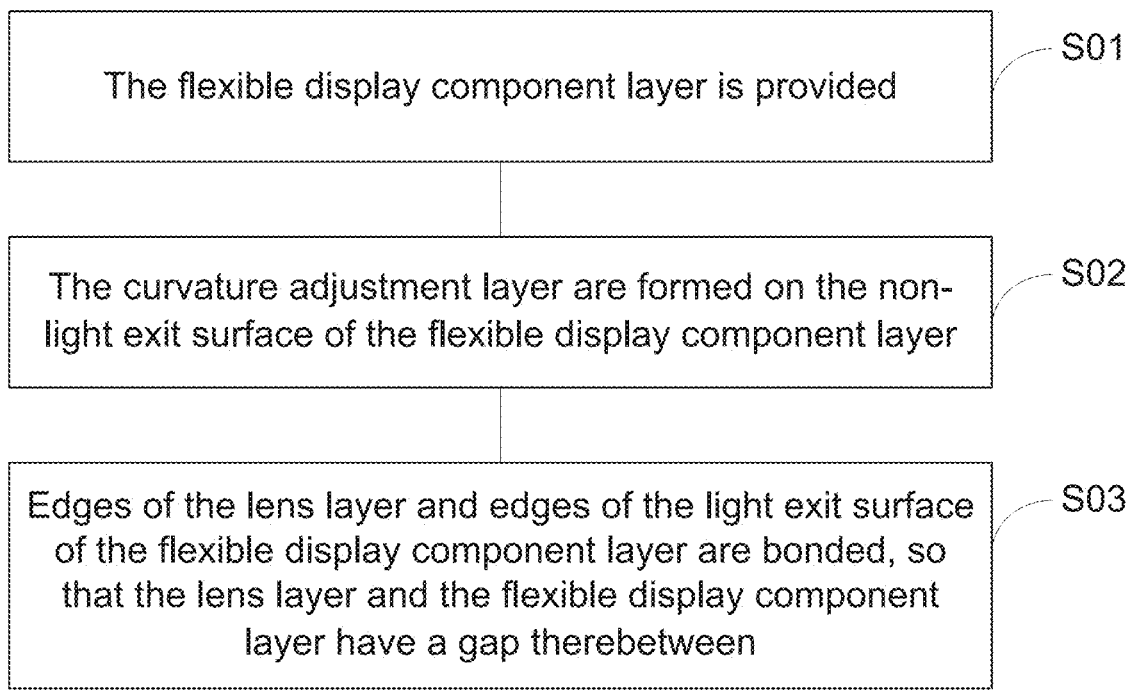
FIG. 10 is a flow chart of a method of manufacturing a virtual display apparatus, in accordance with some embodiments.

Some embodiments of the present disclosure provide a method of manufacturing the virtual display apparatus. As shown in FIG. 10, the method includes S01 to S03.

In S01, referring to FIGS. 3, 7 and 8, the flexible display component layer 2 is provided.

In S02, referring to FIGS. 3, 7 and 8, the curvature adjustment layer 3 are formed on the non-light exit surface 212 of the flexible display component layer 2.

In some examples, a partial structure of the curvature adjustment layer 3 is directly formed on the non-light exit surface 212 of the flexible display component layer 2. In some other examples, the curvature adjustment layer 3 is adhered to the non-light exit surface 212 of the flexible display component layer 2.

In S03, referring to FIGS. 3, 7 and 8, edges of the lens layer 1 and edges of the light exit surface 211 of the flexible display component layer 2 are bonded, so that the lens layer 1 and the flexible display component layer 2 have a gap therebetween.

For example, the lens layer 1 and the flexible display component layer 2 may be bonded by a frame sealant 4 provided at the edges of the lens layer 1 and the flexible display component layer 2.

In the method of manufacturing the virtual display, the deformable curvature adjustment layer 3 is formed on the non-light exit surface 212 of the flexible display component layer 2, and the gap between the lens layer 1 and the flexible display component layer 2 may be adjusted by controlling the deformation state of the curvature adjustment layer 3. In this way, the depth-of-field information of the image displayed by the virtual display apparatus is adjusted.

In some embodiments, the flexible display component layer 21 has a plurality of sub-pixel regions 20. As shown in FIG. 11, S02 includes S110 to S150.

In S110, referring to FIGS. 3, 7 and 8, a plurality of first electrodes 31 are formed on the non-light exit surface 212 of the flexible display component layer 2, and each first electrode 31 is located in a respective one of the plurality of sub-pixel regions 20.

In some examples, referring to FIGS. 3 and 8, the plurality of first electrodes 31 are spaced apart from one another. In this case, the plurality of first electrodes 31 may be formed by a first patterning process. The first patterning process includes, for example, deposition, exposure, developing, etching and stripping processes.

In some other examples, referring to FIG. 7, the plurality of first electrodes 31 are integrally formed. That is, each first electrode is a portion of a first conductive layer, i.e., a whole layer, located in a respective one of the plurality of sub-pixel region 20. For example, the first conductive layer including the first electrodes 31 may be formed through a deposition process.

In S120, referring to FIGS. 3, 7 and 8, a plurality of second electrodes 33 are formed on the curvature adjustment base layer 34, and each second electrode 33 is located in a respective one of a plurality of sub-regions 340.

In some examples, referring to FIGS. 3 and 7, the plurality of second electrodes 33 are spaced apart from one other. In this case, the plurality of second electrodes 33 may be formed by a second patterning process. The second patterning process includes, for example, deposition, exposure, developing, etching and stripping processes.

In some other examples, referring to FIG. 8, the plurality of second electrodes 33 are integrally formed. That is, each second electrode 33 is a portion of a second conductive layer, i.e., a whole layer, located in a respective one of a plurality of sub-regions 340. For example, the second conductive layer including the second electrodes 33 may be formed through a deposition process.

It will be noted that, in a case where the plurality of first electrodes 31 are integrally formed, the plurality of second electrodes 33 are spaced apart from each other. In a case where the second electrodes 33 are integrally formed, the plurality of first electrodes 31 are spaced apart from each other.

In S130, referring to FIGS. 3, 7 and 8, a sealing wall 38 and a plurality of separating walls 37 located in a region surrounded by the sealing wall 38 are formed on the flexible display component layer 2 on which the plurality of first electrodes 31 have been formed, or on the curvature adjustment base layer 34 on which the plurality of second electrodes 33 have been formed, so as to form a plurality of liquid accommodation spaces.

It will be noted that in a case where the plurality of first electrodes are integrally formed, the sealing wall 38 and the plurality of separating wall 37 may be formed on a surface of the first conductive layer including the first electrodes 31 facing away from the flexible display component layer 2. In a case where the plurality of first electrodes 31 are spaced apart from each other, the sealing wall 38, the plurality of separating walls 37 and the plurality of first electrodes 31 may be all formed on the non-light exit surface 212 of the flexible display component layer 2.

In a case where the plurality of second electrodes 33 are integrally formed, the sealing wall 38 and the plurality of separating walls 37 may be formed on a surface of the second conductive layer including the second electrodes 33 proximate to the flexible display component layer 2. In a case where the second electrodes 33 are spaced apart from each other, the sealing wall 38, the plurality of separating walls 37 and the plurality of second electrodes 33 may be all formed on the surface of the curvature adjustment base layer 34 facing the flexible display component layer 2.

In S140, referring to FIGS. 3, 7, and 8, electrorheological fluid 32 is filled in each of the plurality of liquid accommodation spaces.

In S150, referring to FIGS. 3, 7, and 8, the curvature adjustment base layer 34 and the flexible display component layer 2 are aligned, so that an orthographic projection of each sub-region 340 on the flexible display component layer 2 overlaps with a respective one of the plurality of the sub-pixel regions 20.

That is, the plurality of sub-regions 340 are in one-to-one correspondence with the plurality of sub-pixel regions 20, and an orthographic projection of each sub-region 340 on the flexible display component layer 2 overlaps with the corresponding sub-pixel region 20.

In S150, the curvature adjustment base layer 34 and the flexible display component layer 2 are sealed by the sealing wall 38.

The second electrode 33, the corresponding first electrode 31 and the electrorheological fluid 32 between the first electrode 31 and the second electrode 33 form a curvature adjustment unit 30, and electrorheological fluid 32 of every two adjacent curvature adjustment units 30 are separated by at least one separating wall 37. The first electrode 31 and the second electrode 33 of the curvature adjusting unit 30 form an electrode pair.

As for each of sub-pixel regions 20 except sub-pixel regions 20 at the outermost edge in all the sub-pixel regions 20, separating walls 37 (i.e., four separating walls 37) around the sub-pixel region 20 form a liquid accommodation space. As for each of the sub-pixel regions 20 at the outermost edge, a portion of the sealing wall 38 and separating walls 37 around the sub-pixel region 20 form the liquid accommodation space. In this case, after the liquid accommodation space is filled with the electrorheological fluid, and the curvature adjustment base layer 34 and the first flexible base layer 21 are sealed, the enclosed liquid accommodation space is formed.

In the method of manufacturing the virtual display apparatus, the curvature adjustment layer 3 is formed by using the electrorheological fluid 32. Since the deformation state of the electrorheological fluid 32 changes under different electric field intensity, the deformation state of the electrorheological fluid 32 may be controlled by controlling the values of voltages to be applied to the first electrode 31 and the second electrode 33 of the curvature adjustment unit 30, so as to adjust the bending state of the flexible display component layer 2 and control the distances between the first surface 14 of the lens layer 1 and different positions of the light exit surface 211 of the flexible display component layer 2. Thus, the depth-of-field information of regions of the image displayed by the flexible display component layer 2 may be adjusted, thereby improving the 3D display effect. In addition, the liquid-solid conversion speed of the electrorheological fluid 32 is in milliseconds and is equivalent to the image refresh speed, and thus it is conducive to achieving a smooth 3D picture.

In some embodiments, as shown in FIG. 12, 3110 includes S111 and S112.

In S111, as shown in FIG. 13A, a first conductive layer 3100 is deposited on the non-light exit surface 212 of the flexible display component layer 2.

The first conductive layer 3100 may be a first transparent conductive layer, such as an indium tin oxide layer, an indium zinc oxide layer or an indium gallium oxide layer. The first conductive layer 3100 may also be a first metal conductive layer, such as a silver metal layer or a zinc metal layer. The material of the first conductive layer 3100 is not limited thereto.

In S112, as shown in FIG. 13B, the first conductive layer 3100 is etched to form the plurality of first electrodes 31 spaced apart from each other. Each first electrode 31 is located in the corresponding sub-pixel region 20.

In this case, S120 of forming the plurality of second electrodes 33 on the curvature adjustment base layer 34 may include: as shown in FIG. 8, depositing a second conductive layer on the curvature adjustment base layer 34, a portion of the second conductive layer in each sub-region 340 serving as a second electrode 33.

In some other embodiments, S110 of forming the plurality of first electrodes 31 on the non-light exit surface 212 of the flexible display component layer 2 includes: as shown in FIG. 7, depositing a first conductive layer 3100 on the non-light exit surface 212 of the flexible display component layer 2, a portion of the first conductive layer 3100 in each sub-pixel region 20 serving as a first electrode 31.

In this case, as shown in FIG. 14, S120 includes S121 and S122.

In S121, as shown in FIG. 15A, a second conductive layer 330 is deposited on the curvature adjustment base layer 34.

The second conductive layer 330 may be a second transparent conductive layer, such as an indium tin oxide layer, an indium zinc oxide layer or an indium gallium oxide layer. The second conductive layer 330 may also be a second metal conductive layer, such as a silver metal layer or a zinc metal layer. The material of the second conductive layer 330 is not limited thereto.

In S122, as shown in FIG. 15B, the second conductive layer 330 is etched to form the plurality of second electrodes 33 spaced apart from each other. Each second electrode 33 is located in a corresponding sub-region 340.

In some embodiments, S130 of forming the sealing wall 38 and the plurality of separating walls 37 on the flexible display component layer 2 on which the plurality of first electrodes have been formed, includes: forming the sealing wall 38 and the plurality of separating walls 37 on the non-light exit surface 212 of the flexible display component layer 2 by using the sealant material.

In some other embodiments, S130 of forming the sealing wall 38 and the plurality of separating walls 37 on the curvature adjustment base layer 34 on which the plurality of second electrodes have been formed, includes: forming the sealing wall 38 and the plurality of separating walls 37 on a surface of the curvature adjustment base layer 34 facing the flexible display component layer 2 by using the sealant material.

In some embodiments, forming the curvature adjustment layer 3 further includes: forming a plurality of first lead wires 35 on the non-light exit surface 212 of the flexible display component layer 2, and forming a plurality of second lead wires 36 on the curvature adjustment base layer 34. One of the first lead wires 35 is electrically connected to a first electrode 31 of a corresponding curvature adjustment unit 30, and one of the second lead wires 36 is electrically connected to the second electrode 33 of the corresponding curvature adjustment unit 30.

In some other embodiments, all the first electrodes 31 are integrally formed. Forming the curvature adjustment layer 3 further includes: forming at least one first lead wire 35 on the non-light exit surface 212 of the flexible display component layer 2, and forming a plurality of second lead wires 36 on the curvature adjustment base layer 34. The at least one first lead wire 35 is electrically connected to the first electrodes 31 having the integrated structure, and one of the second lead wires 36 is electrically connected to a second electrode 33 of a corresponding curvature adjustment unit 30.

In some other embodiments, all the second electrodes 32 are integrally formed. Forming the curvature adjustment layer 3 further includes: forming a plurality of first lead wires 35 on the non-light exit surface 212 of the flexible display component layer 2, and forming at least one second lead wire 36 on the curvature adjustment base layer 34. One of the plurality of first lead wires 35 is electrically connected to a first electrode 31 of a corresponding curvature adjusting unit 30, and the at least one second lead wire 36 is electrically connected to the second electrodes 33 having the integrated structure.

The method may further include assembling the processor 5 and the controller 50 connected to the processor 5. For example, the controller 50 is electrically connected to all the first lead wires 35 and all the second lead wires 36.

That is, one terminal of the first lead wire 35 is electrically connected to the first electrode 31 of the curvature adjustment unit 30, and the other terminal of the first lead wire 35 is electrically connected to the controller 50. One terminal of the second lead wire 36 is electrically connected to the second electrode 33 of the curvature adjustment unit 30 and the other terminal of the second lead wire 36 is electrically connected to the controller 50. The controller 50 is connected to the processor 5. The controller 50 is configured to receive image data of an image to be displayed by the flexible display component layer 2, obtain at least one deformation signal (such as voltage signals) according to the image data, and send the at least one deformation signal to the first electrodes 31 and the second electrodes 33 of the plurality of curvature adjustment units 30 in response to receiving an adjustment signal. The processor 5 is configured to send the adjustment signal in response to receiving the image data.

For example, after the controller 50 receives the adjustment signal sent by the processor 5, the controller 50 provides voltage signals to the first electrode 31 and the second electrode 33 of the curvature adjustment unit 30 through the first lead wire 35 and the second lead wire 36, respectively.

For the manner in which the controller 50 controls values of the voltages applied to the electrode pair, reference may be made to the above description of the virtual display apparatus, and details are not described herein again.

In some embodiments, forming the flexible display component layer 2 includes: forming a thin film transistor layer 223, a light emitting functional layer 222 and a second flexible base layer 221 sequentially on a second surface of the first flexible base layer 21.

For example, the first conductive layer 3100 may be deposited on a third surface of the first flexible base layer 21 (i.e., the non-light exit surface 212 of the flexible display component layer 2), and then the multi-layer structure 22 is formed on the second surface of the first flexible base layer 21 (that is, the thin film transistor layer 223, the light emitting functional layer 222 and the second flexible base layer 221 are formed sequentially). Herein, the second surface and the third surface are two opposite surfaces of the first flexible base layer 21.

Herein, a material of the first flexible base layer 21 and the second flexible base layer 221 may include at least one of polyethylene glycol terephthalate (PET), polyimide (PI) or other flexible materials.

Since the first conductive layer 3100 is formed before the multi-layer structure 22, so that the influence of high temperature during deposition of the first conductive layer 3100 on the multi-layer structure 22 may be avoided, and the risk of failure of the flexible display component layer 2 may be reduced.

In some examples, as shown in FIG. 16, the method of manufacturing the virtual display apparatus includes S210 to S280.

In S210, a first indium tin oxide layer is deposited on the third surface of the first flexible base layer 21 (i.e. the non-light exit surface 212 of flexible display component layer 2), and the first indium tin oxide layer is etched to form first electrodes 31 and first lead wires 35. The first electrodes 31 are arranged at intervals, and each first electrode 31 is located in a corresponding sub-pixel region 20 and is connected to a first lead wire 35.

In S220, a second indium tin oxide layer is deposited on the curvature adjusting base layer 34, and the second indium tin oxide layer is etched to form second electrodes 33 and second lead wires 36. The second electrodes 33 are arranged at intervals, and each second electrode 33 is located in a corresponding sub-region 340 and is connected to a second lead wire 36.

In S230, a sealing wall 38 and a plurality of separating walls 37 are formed on the curvature adjustment layer 3, so as to form a plurality of liquid accommodation spaces. The material of the sealing wall 38 and the plurality of separating walls 37 may include or may be a sealant.

Herein, as for each of sub-regions 340 except sub-regions 340 at the outermost edge in all the sub-regions 340, separating walls 37 (i.e. four separating walls 37) around the sub-region 340 and the second electrode 33 in the sub-region 340 forms a liquid accommodation space. As for each of the sub-regions 340 at the outermost edge, a portion of the sealing wall 38 and separating walls 37 around the sub-region 340, and the second electrode 33 in the sub-region 340 form a liquid accommodation space. Since a plurality of the second electrodes 33 are provided, there are a plurality of liquid accommodation spaces and the number of the plurality of liquid accommodation spaces is equal to the number of the plurality of second electrodes 33.

In S240, the electrorheological fluid 32 is filled in each of the plurality of the liquid accommodation spaces.

Here, the filling mode of the electrorheological fluid 32 includes, but is not limited to, pouring or dripping.

For example, the electrorheological fluid 32 may be non-aqueous electrorheological fluid, such as barium metatitanate (BaTiOx)-small molecule organic composite electrorheological fluid. The method of preparing the BaTiOx-small molecule organic composite electrorheological fluid includes: preparing BaTiOx by means of liquid phase reaction of barium acetate, n-butyl titanate, dodecylamine and ethanol at 40° C. to 60° C.; preparing composite particles of the BaTiOx and the small molecule organics by means of liquid phase reaction of the obtained BaTiOx and small molecule organics such as dimethyl sulfoxide, formamide, glycol, n-amyl alcohol, etc.; drying the composite particles for 4 h to 8 h; and preparing the electrorheological fluid rapidly by treating the dried composite particles and dimethicone for 2 h in the environment of 15° C. (strain $\varepsilon f=2.60\sim2.80$, density $\rho=0.9\sim1.0$ g/cm3 and viscosity $\eta\approx500$ mPa). The weight ratio of the composite particles to the dimethicone is 37%. Of course, the recipe and the preparing method of the electrorheological fluid 32 are not limited thereto, and here is only the illustrative description.

In S250, the curvature adjustment layer 34 and the first flexible base layer 21 are aligned, so that an orthographic projection of each sub-region 340 on the flexible display component layer 2 overlaps with a respective one of the plurality of the sub-pixel regions 20; and the curvature adjustment base layer 34 and the first flexible base layer 21 are sealed to form the plurality of enclosed liquid accommodation spaces.

In S260, a thin film transistor layer 223, a light emitting functional layer 222 and a second flexible base layer 221 are formed sequentially on the second surface of the first flexible base layer 21 to obtain a flexible display component layer 2.

In S270, edges of the first surface 14 of the lens layer 1 and edges of the light exit surface 211 of the flexible display component layer 2 are bonded, so that the lens layer 1 and the flexible display component layer 2 have a gap therebetween.

In some examples, a surface of the second flexible base layer 221 is the light exit surface 211, and the second flexible base layer 221 in S260 may be bonded to the lens layer 1 at the light exist surface 211 through a frame sealant, and then another opposite surface of the second flexible base layer 221 is bonded onto a surface of the light emitting functional layer 222 facing away from the thin film transistor layer 223, so that the light emitting functional layer 222 is encapsulated.

In addition, the controller 50 may be electrically connected to a driver connected to the flexible display component 2, and the processor 5 is electrically connected to the controller 50 that is connected to all the first lead wires 35 and all the second lead wires 36.

Figure 17:
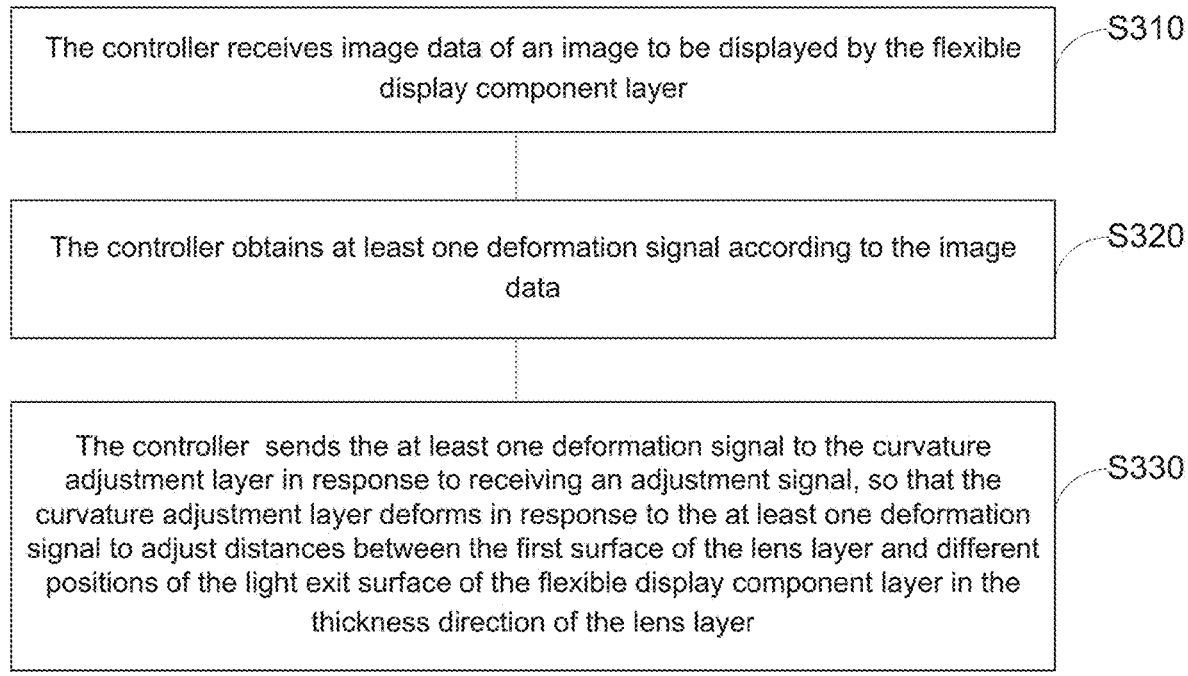
FIG. 17 is a flow chart of a method of controlling a virtual display apparatus, in accordance with some embodiments.

Some embodiments of the present disclosure provide a method of controlling the virtual display apparatus. As shown in FIG. 17, the method includes the following S310 and S320.

In 3310, the controller 50 receives image data of an image to be displayed by the flexible display component layer 2.

The image data includes depth-of-field information of each sub-pixel image of the image to be displayed.

In some examples, the controller 50 may be electrically connected to a driver for driving the flexible display component layer 2, for obtaining the image data of the image to be displayed by the flexible display component layer 2 in real time. In some other examples, the controller 50 may also retrieves the image data of the image to be displayed by the flexible display component layer 2 from a memory of the virtual display apparatus.

In S320, the controller 50 obtains at least one deformation signal according to the image data.

In S330, the controller 50 sends the at least one deformation signal to the curvature adjustment layer 3 in response to receiving an adjustment signal, so that the curvature adjustment layer 3 deforms in response to the at least one deformation signal to adjust distances between the first surface 14 of the lens layer 1 and different positions of the light exit surface 211 of the flexible display component layer 2 in the thickness direction of the lens layer 1.

Therefore, a bending state of the flexible display component layer 2 is adjusted by controlling the deformation state of the curvature adjustment layer 3, so that the distances between the light exit surface 211 of the flexible display component layer 2 and the first surface 14 of the lens layer 1 may be adjusted. Thus, the depth-of-field information of the image displayed by the flexible display component layer 2 may be adjusted, so that the 3D display effect may be improved.

In some embodiments, the curvature adjustment layer 3 includes a plurality of curvature adjustment units 30, and each curvature adjustment unit 30 includes a first electrode 31 and a second electrode 33 that are arranged oppositely, and electrorheological fluid 32 located between the first electrode 31 and the second electrode 33. For example, the first electrode 31 and the second electrode 33 of the curvature adjustment unit 30 constitute an electrode pair.

In this case, S320 includes: obtaining, by the controller 50, voltage signals according to the image data. S330 includes: sending, by the controller 50, the voltage signals to first electrodes and second electrodes of the plurality of curvature adjustment units 30 in response to the adjustment signal, so as to adjust the state of the electrorheological fluid 32 of the curvature adjustment unit 30.

In this way, the distances between the first surface 14 of the lens layer 1 and different positions of the light exit surface 211 of the flexible display component layer 2 in the thickness direction of the lens layer 1 may be adjusted by controlling the deformation state of the electrorheological fluid 32 of each curvature adjustment unit 30.

In some embodiments, the controller 50 includes a storage medium pre-storing the image data of the image to be displayed by the virtual display apparatus (the image data of the image to be displayed includes the depth-of-field information of all the sub-pixel images of the image to be displayed), and values of voltage to be applied to the electrode pair of the curvature adjustment layer 3 corresponding to the image data of the image to be displayed. In this way, in the process of displaying the image by the virtual display apparatus, after the controller 50 receives the adjustment signal, the controller 50 adjusts the voltages actually applied to the electrode pair of the curvature adjusting layer according to the pre-stored values of voltage to be applied to the electrode pair corresponding to the image data of the image to be displayed.

In some other embodiments, the controller 50 includes a storage medium pre-storing the image data of the image to be displayed by the virtual display apparatus (the image data of the image to be displayed includes the depth-of-field information of all the sub-pixel images of the image to be displayed), and a correspondence between the depth-of-field information and voltage values of each electrode pair. In this way, in the process of displaying the images by the virtual display apparatus, after receiving the adjustment signal, the controller 50 determines the values of the voltage to be applied to the electrode pair of the curvature adjustment layer 3 according to the pre-stored depth-of-field information of each sub-pixel image and the pre-stored correspondence between the depth-of-field information and the voltage values of the electrode pair, and adjusts the voltages actually applied to the electrode pair.

Figure 18:
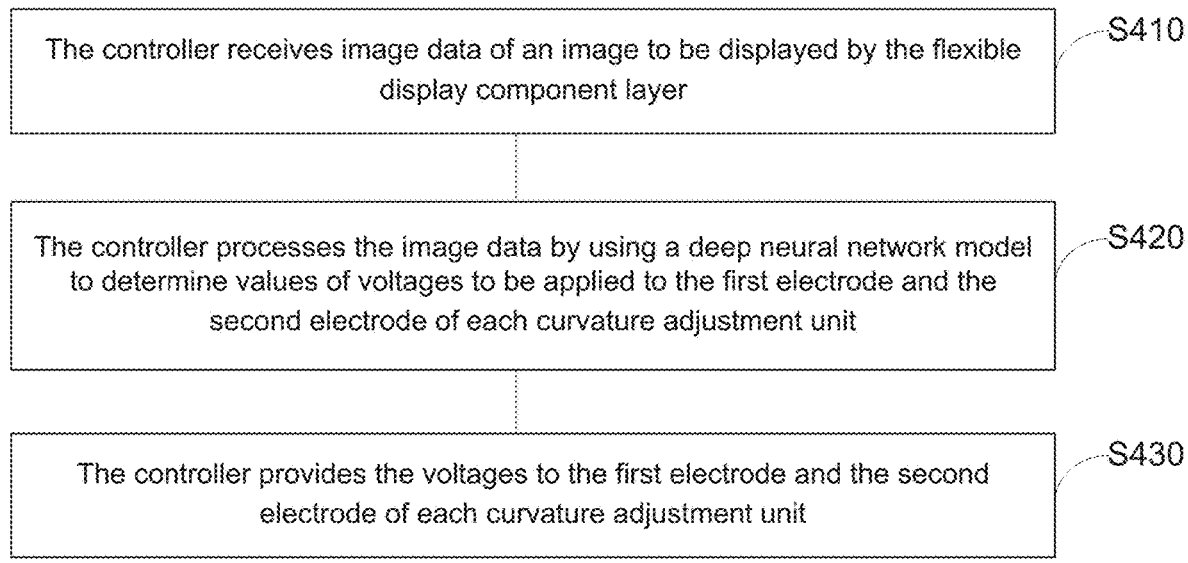
FIG. 18 is a flow chart of another method of controlling a virtual display apparatus, in accordance with some embodiments.

FIG. 18 is a flow chart of another method of controlling the virtual display apparatus according to some embodiments of the present disclosure. The embodiments are similar to the above embodiments of the method of controlling the virtual display apparatus. For simplicity, the similarities will not be described and the differences will be mainly described here. As shown in FIG. 18, the method of controlling the virtual display apparatus includes the following steps S410 to S430.

In S410, the controller 50 receives image data of an image to be displayed by the flexible display component layer 2.

For example, the image data includes color information and depth-of-field information of each sub-pixel image of the image to be displayed. Focusing effects of the lens layer 1 of the virtual display apparatus on different colors of light are different, so that the image data of the image to be displayed may include color information and depth-of-field information of each sub-pixel image of the image to be displayed. In this case, if the flexible display component layer 2 is to display an image, the controller 50 provides voltage signals to the electrode pair of each curvature adjustment unit 30 to adjust the depth-of-field of each sub-pixel image of the image. In addition, the controller 50 provides voltage signals to the pixel driving circuit of the sub-pixel 200 of the flexible display component layer 2 to control a driving voltage of a light-emitting device in the sub-pixel 200, thereby adjusting light-emitting degree of the sub-pixel 200. In this way, clear and 3D image display effect may be achieved.

In S420, the controller 5 processes the image data by using a deep neural network model to determine values of voltages to be applied to the first electrode 31 and the second electrode 33 of each curvature adjustment unit 20.

The deep neural network model may be a back propagation (BP) neural network model or other neural network models. The neutral network model may be obtained by training a learning model. The neutral network model may be included in the controller 50, or may be independent of the controller 50 and included in a component or a module of the virtual display apparatus.

In some embodiments, a set of sample data for training the learning model may include image data of a sample image, and values of voltages applied to each electrode pair of the curvature adjustment layer 3 when the sample image is actually displayed by the flexible display component layer 2 in a clear 3D display. The learning model may obtain parameters of the learning model according to the image data and the values of the voltages applied to the electrode pair. Based on this, the deep neural network model may be finally obtained by training the learning model with the multiple sets of sample data. After the neutral network model is obtained, the controller 50 obtains the image data of the image to be displayed and inputs the image data of the image to be displayed into the neutral network model, so as to determine the values of the voltages to be applied to the electrode pair of the curvature adjustment unit 30.

In some other embodiments, a set of sample data for training the learning model may include a sample image, and values of voltages applied to each electrode pair of the curvature adjustment layer 3 when the sample image is actually displayed by the flexible display component layer 2 in a clear 3D display. The learning model receives image data from the sample image and trains parameters of the learning model according to the image data and the values of the voltages applied to each electrode pair. Based on this, the deep neutral network model may be finally obtained by training the learning model with the multiple groups of sample images. After the neutral network model is obtained, the controller 50 obtains the image data of the image to be displayed and inputs the image data of the image to be displayed into the neutral network model, so as to determine the values of the voltages to be applied to the electrode pair of the curvature adjustment unit 30.

In S430, the controller 50 provides the voltages to the first electrode 31 and the second electrode 33 of each curvature adjustment unit 30.

In some embodiments, image data of any image to be displayed includes feature vectors of a plurality of sub-pixel images, and the feature vector may represent color information and depth-of-field information of each sub-pixel image of the image to be displayed. For example, the feature vector includes N color dimensions and 1 depth-of-field dimension, and N is the number of the colors of sub-pixels 200 in the flexible display component layer 2.

Herein, the feature vector may be represented by a four-dimensional vector, that is, N is 3. The first three dimensions represent color information and the fourth dimension represents depth-of-field information. For example:

[1, 0, 0, 0] represents that a sub-pixel 200 is a red sub-pixel and its depth-of-field is 0.

[0, 1, 0, 0] represents that a sub-pixel 200 is a green sub-pixel and its depth-of-field is 0.

[0, 0, 1, 0] represents that a sub-pixel 200 is a blue sub-pixel and its depth-of-field is 0.

[1, 0, 0, 1] represents that a sub-pixel 200 is a red sub-pixel and its depth-of-field is 1.

In some embodiments, S420 includes: processing, by the controller 50, the feature vectors of the plurality of sub-pixel images by using the deep neural network model to determine the values of the voltages to be applied to the first electrode 31 and the second electrode 33 of each curvature adjustment unit 30. That is, the controller 50 processes the feature vector of each sub-pixel image by using the deep neutral network model to determine the values of the voltages to be applied to each electrode pair of the curvature adjustment layer 3 corresponding to the sub-pixel image.

In an example where the second electrode 33 is grounded, and the deep neutral network model receives a feature vector corresponding to a sub-pixel image, which is [1, 0, 0, 3.5], and processes the feature vector and outputs a voltage of 0.7V to be applied to the first electrode 31 corresponding to the sub-pixel image. Similarly, as for each electrode pair, the deep neutral network model may determine values of the voltages to be applied to it. The controller 50 provides the voltages to the electrode pair, so as to control distances between different sub-pixels 200 of the flexible display component layer 2 and the lens layer 2, and adjust the imaging focal length of different positions of the image in the user's eyes.

In the method of controlling the virtual display apparatus, the controller processes the image data by using the deep neural network model to determine values of the voltages to be applied to each electrode pair of the curvature adjustment layer 3, so that values of the voltages applied to the electrode pair of the curvature adjustment unit 30 is adjusted. In this way, the voltages on the electrode pair may be determined accurately, so that clear and 3D image display effect may be achieved.

The processor described in the above embodiments is executed, for example, by a microprocessor programmed to perform one or more of the operations and/or functions described herein. The controller is implemented in whole or in part by specially configured hardware (e.g., by one or more application-specific integrated circuits (ASIC(s))).

Those skilled in the art may understand that steps, measures and schemes in various operations, methods and flows that have been discussed herein may be alternated, changed, combined or deleted. Further, other steps, measures and schemes in various operations, methods and flows that have been discussed herein also may be alternated, changed, rearranged, decomposed, combined or deleted.

In the description of the specification, the specific features, structures, materials or characteristics may be combined in any one or more embodiments or examples in any proper manners.

It will be understood that, steps in the flow charts of the accompanying drawings are shown in order according to arrows, but these steps are not necessarily performed sequentially according to the sequence indicated by arrows. Unless explicitly stated in this content, the execution sequence of these steps is not strictly limited, and these steps may be executed in other sequences. Furthermore, at least a part of steps in the flow charts of the accompanying drawings may include sub-steps or stages, these sub-steps or stages are not necessarily executed and completed at the same time, but may be executed at different times; and these steps or stages are not necessarily executed sequentially, but may be executed with other steps or at least a part of sub-steps or stages of other steps in turns or alternately.

The foregoing descriptions are merely part of implementations of the present disclosure. It should be noted that, for a person of ordinary skill in the art, several improvements and embellishments may be made without deviating from the principle of the present disclosure, and these improvements and embellishments shall also be included in the protection scope of the present disclosure.

What is claimed is:

1. A virtual display apparatus, comprising:
   a flexible display component layer, wherein the flexible display component layer has a light exit surface and a non-light exit surface opposite to the light exit surface, and the light exit surface is a surface via which light emitted by the flexible display component layer exits therefrom;
   a lens layer disposed at the light exit surface of the flexible display component layer and configured to converge the light, wherein the lens layer has a first surface facing the flexible display component layer, and the first surface of the lens layer and the light exit surface of the flexible display component layer have a gap therebetween; and
   a curvature adjustment layer disposed on the non-light exit surface of the flexible display component layer, wherein the curvature adjustment layer is configured to deform in response to at least one deformation signal, so as to adjust distances between the first surface of the lens layer and different positions of the light exit surface of the flexible display component layer along a thickness direction of the lens layer, wherein the curvature adjustment layer includes:
   a curvature adjustment base layer;
   a sealing wall disposed between the curvature adjustment base layer and the flexible display component layer, wherein the sealing wall, the curvature adjustment base layer and the flexible display component layer together form a cavity;
   a plurality of curvature adjustment units disposed in the cavity, wherein each curvature adjustment unit includes a first electrode and a second electrode that are disposed oppositely along the thickness direction of the lens layer, and electrorheological fluid located between the first electrode and the second electrode; and
   a plurality of separating walls disposed in the cavity, wherein electrorheological fluid of every two adjacent curvature adjustment units are separated by at least one separating wall, and
   wherein the flexible display component layer has a plurality of sub-pixel regions, and an orthographic projection of each curvature adjustment unit on the flexible display component layer overlaps with a corresponding sub-pixel region.

2. The virtual display apparatus according to claim 1, wherein all first electrodes are disposed on the non-light exit surface of the flexible display component layer, and all second electrodes are disposed on a surface of the curvature adjustment base layer facing the flexible display component layer.

3. The virtual display apparatus according to claim 2, wherein the curvature adjustment layer further includes at least one first lead wire disposed at a side of the flexible display component layer proximate to the curvature adjustment base layer, and at least one second lead wire disposed at a side of the curvature adjustment base layer proximate to the flexible display component layer, wherein,
   all the first electrodes are spaced apart from each other, and the at least one first lead wire includes a plurality of first lead wires, and one of the plurality of first lead wires is electrically connected to a first electrode of a corresponding curvature adjustment unit; and all the second electrodes are spaced apart from each other, and the at least one second lead wire includes a plurality of second lead wires, and one of the plurality of second lead wires is electrically connected to a second electrode of the corresponding curvature adjustment unit;
   or,
   all the first electrodes are integrally formed, and the at least one first lead wire is electrically connected to the first electrodes; and all second electrodes are spaced apart from each other, and the at least one second lead wire includes a plurality of second lead wires, and one of the plurality of second lead wires is electrically connected to a second electrode of a corresponding curvature adjusting unit;
   or,
   all the second electrodes are integrally formed, and the at least one second lead wire is electrically connected to the second electrodes; and all the first electrodes are spaced apart from each other, and the at least one first lead wire includes a plurality of first lead wires, and one of the plurality of first lead wires is electrically connected to a first electrode of a corresponding curvature adjustment unit.

4. The virtual display apparatus according to claim 3, further comprising a controller, wherein the at least one first lead wire and the at least one second lead wire are electrically connected to the controller; and the at least one deformation signal includes voltage signals, and the controller is configured to provide voltage signals to first electrodes and second electrodes of the plurality of curvature adjustment units.

5. The virtual display apparatus according to claim 1, wherein a material of the plurality of separating walls and the sealing wall is a sealant.

6. The virtual display apparatus according to claim 1, wherein the lens layer is a planar metalens.

7. The virtual display apparatus according to claim 1, further comprising a frame sealant disposed between the lens layer and the flexible display component layer to seal the lens layer and the flexible display component layer.

8. The virtual display apparatus according to claim 1, wherein the flexible display component layer includes a first flexible base layer and a multi-layer structure stacked along the thickness direction of the lens layer, and the multi-layer structure is closer to the lens layer than the first flexible base layer, wherein, the multi-layer structure includes a second flexible base layer, a light-emitting functional layer and a thin film transistor layer that are stacked;

the second flexible base layer is disposed at a side of the light-emitting functional layer proximate to the lens layer, and the thin film transistor layer is disposed at another side of the light-emitting functional layer proximate to the first flexible base layer.

9. A method of manufacturing the virtual display apparatus according to claim 1, the method comprising:

providing the flexible display component layer, wherein the flexible display component layer has a plurality of sub-pixel regions;

forming the curvature adjustment layer on the non-light exit surface of the flexible display component layer; and bonding edges of the lens layer and edges of the light exit surface of the flexible display component layer, so that the lens layer and the flexible display component layer have a gap therebetween, wherein forming the curvature adjustment layer includes:

forming a plurality of first electrodes on the non-light exit surface of the flexible display component layer, wherein each first electrode is located in a respective one of the plurality of sub-pixel regions;

forming a plurality of second electrodes on a curvature adjustment base layer, wherein each second electrode is located in a respective one of a plurality of sub-regions;

forming a sealing wall and a plurality of separating walls in a region surrounded by the sealing wall on the non-light exit surface of the flexible display component layer on which the plurality of first electrodes have been formed or on the curvature adjustment base layer on which the plurality of second electrodes have been formed, so as to form a plurality of accommodation spaces;

filling electrorheological fluid in each liquid accommodation space;

aligning the curvature adjustment base layer and the flexible display component layer, so that an orthographic projection of each sub-region on the flexible display component layer overlaps with a respective one of the plurality of the sub-pixel regions; and sealing the curvature adjustment base layer and the flexible display component layer, wherein a second electrode, a corresponding first electrode, and electrorheological fluid between the second electrode and the first electrode form a curvature adjustment unit, and electrorheological fluid of every two adjacent curvature adjustment units are separated by at least one separating wall.

10. The method according to claim 9, wherein forming the plurality of first electrodes on the non-light exit surface of the flexible display component layer, includes:

depositing a first conductive layer on the non-light exit surface of the flexible display component layer; and etching the first conductive layer to form the plurality of first electrodes spaced apart from each other, and forming the plurality of second electrodes on the curvature adjustment base layer, includes:

depositing a second conductive layer on the curvature adjustment base layer, wherein a portion of the second conductive layer located in each sub-region serves as a second electrode.

11. The method according to claim 9, wherein forming the plurality of first electrodes on the non-light exit surface of the flexible display component layer, includes:

depositing a first conductive layer on the non-light exit surface of the flexible display component layer, wherein a portion of the first conductive layer located in each sub-pixel region serves as a first electrode, and forming the plurality of second electrodes on the curvature adjustment base layer, includes:

depositing a second conductive layer on the curvature adjustment base layer; and etching the second conductive layer to form the plurality of second electrodes spaced apart from each other.

12. The method according to claim 9, wherein if the sealing wall and the plurality of separating walls are formed on the non-light exit surface of the flexible display component layer, forming a sealing wall and a plurality of separating walls on the non-light exit surface of the flexible display component layer, includes:

forming the sealing wall and the plurality of separating walls on the non-light exit surface of the flexible display component layer by using a sealant material; and if the sealing wall and the plurality of separating walls are formed on the curvature adjustment base layer, forming a sealing wall and a plurality of separating walls on the curvature adjustment base layer, includes:

forming the sealing wall and the plurality of separating walls on the curvature adjustment base layer by using a sealant material.

13. The method according to claim 9, wherein forming the curvature adjustment layer further includes:

forming a plurality of first lead wires on the non-light exit surface of the flexible display component layer, wherein one of the plurality of first lead wires is electrically connected to a first electrode of a corresponding curvature adjustment unit; and forming a plurality of second lead wires on the curvature adjustment base layer, wherein one of the plurality of second lead wires is electrically connected to a second electrode of the corresponding curvature adjustment unit;

or, forming the curvature adjustment layer further includes:
forming at least one first lead wire on the non-light exit surface of the flexible display component layer, wherein the at least one first lead wire is electrically connected to the plurality of first electrodes that are integrally formed; and
forming a plurality of second lead wires on the curvature adjustment base layer, wherein one of the plurality of second lead wires is electrically connected to a second electrode of a corresponding curvature adjustment unit; or,
forming the curvature adjustment layer further includes:
forming a plurality of first lead wires on the non-light exit surface of the flexible display component layer, wherein one of the plurality of first lead wires is electrically connected to a first electrode of a corresponding curvature adjustment unit; and
forming at least one second lead wire on the curvature adjustment base layer, wherein the at least one second lead wire is electrically connected to the plurality of second electrodes that are integrally formed.

14. A method of controlling the virtual display apparatus according to claim 1, the virtual display apparatus further comprising a controller, the method comprising:
receiving, by the controller, image data of an image to be displayed by the flexible display component layer;
obtaining, by the controller, at least one deformation signal according to the image data;
sending, by the controller, the at least one deformation signal to the curvature adjustment layer in response to receiving an adjustment signal, so that the curvature adjustment layer deforms in response to the at least one deformation signal to adjust distances between the first surface of the lens layer and different positions of the light exit surface of the flexible display component layer along the thickness direction of the lens layer.

15. The method according to claim 14, wherein the curvature adjustment layer includes a plurality of curvature adjustment units, and each curvature adjustment unit includes a first electrode and a second electrode that are disposed oppositely, and an electrorheological fluid located between the first electrode and the second electrode;
obtaining, by the controller, the at least one deformation signal according to the image data, includes:
obtaining, by the controller, voltage signals according to the image data; and
sending, by the controller, the at least one deformation signal to the curvature adjustment layer in response to an adjustment signal, so that the curvature adjustment layer deforms in response to the deformation signal, includes:
sending, by the controller, the voltage signals to first electrodes and second electrodes of the plurality of curvature adjustment units in response to the adjustment signal, so as to adjust a state of the electrorheological fluid of each curvature adjustment unit.

16. The method according to claim 15, further comprising:
obtaining, by the controller, voltage signals according to the image data, includes:
processing, by the controller, the image data by using a deep neural network model, to determine values of voltages to be applied to a first electrode and a second electrode of each curvature adjustment unit.

17. The method according to claim 16, wherein the image data includes feature vectors of a plurality of sub-pixel images, each feature vector includes N color dimensions and one depth-of-field dimension, and N is a number of colors of sub-pixels in the flexible display component layer; and
processing, by the controller, the image data by using the deep neural network model to determine values of voltages to be applied to the first electrode and the second electrode of each curvature adjustment unit, includes:
processing, by the controller, the feature vectors of the plurality of sub-pixel images by using the deep neural network model to determine the values of voltages to be applied to the first electrode and the second electrode of the curvature adjustment unit corresponding to each sub-pixel image.

18. A virtual display apparatus, comprising:
a flexible display component layer, wherein the flexible display component layer has a light exit surface and a non-light exit surface opposite to the light exit surface, and the light exit surface is a surface via which light emitted by the flexible display component layer exits therefrom;
a lens layer disposed at the light exit surface of the flexible display component layer and configured to converge the light, wherein the lens layer has a first surface facing the flexible display component layer, and the first surface of the lens layer and the light exit surface of the flexible display component layer have a gap therebetween; and
a curvature adjustment layer disposed on the non-light exit surface of the flexible display component layer, wherein the curvature adjustment layer is configured to deform in response to at least one deformation signal, so as to adjust distances between the first surface of the lens layer and different positions of the light exit surface of the flexible display component layer along a thickness direction of the lens layer, wherein the curvature adjustment layer includes:
a curvature adjustment base layer;
a sealing wall disposed between the curvature adjustment base layer and the flexible display component layer, wherein the sealing wall, the curvature adjustment base layer and the flexible display component layer together form a cavity;
a plurality of curvature adjustment units disposed in the cavity, wherein each curvature adjustment unit includes a first electrode and a second electrode that are disposed oppositely along the thickness direction of the lens layer, and electrorheological fluid located between the first electrode and the second electrode; and
a plurality of separating walls disposed in the cavity, wherein electrorheological fluid of every two adjacent curvature adjustment units are separated by at least one separating wall;
wherein all first electrodes are disposed on the non-light exit surface of the flexible display component layer, and all second electrodes are disposed on a surface of the curvature adjustment base layer facing the flexible display component layer;
wherein the curvature adjustment layer further includes at least one first lead wire disposed at a side of the flexible display component layer proximate to the curvature adjustment base layer, and at least one second lead wire disposed at a side of the curvature adjustment base layer proximate to the flexible display component layer, wherein,
all the first electrodes are spaced apart from each other, and the at least one first lead wire includes a plurality of first lead wires, and one of the plurality of first lead wires is electrically connected to a first electrode of a corresponding curvature adjustment unit; and all the second electrodes are spaced apart from each other, and the at least one second lead wire includes a plurality of second lead wires, and one of the plurality of second lead wires is electrically connected to a second electrode of the corresponding curvature adjustment unit;

or, all the first electrodes are integrally formed, and the at least one first lead wire is electrically connected to the first electrodes; and all second electrodes are spaced apart from each other, and the at least one second lead wire includes a plurality of second lead wires, and one of the plurality of second lead wires is electrically connected to a second electrode of a corresponding curvature adjusting unit;

or, all the second electrodes are integrally formed, and the at least one second lead wire is electrically connected to the second electrodes; and all the first electrodes are spaced apart from each other, and the at least one first lead wire includes a plurality of first lead wires, and one of the plurality of first lead wires is electrically connected to a first electrode of a corresponding curvature adjustment unit;

the virtual display apparatus further comprising a controller, wherein the at least one first lead wire and the at least one second lead wire are electrically connected to the controller; and the at least one deformation signal includes voltage signals, and the controller is configured to provide voltage signals to first electrodes and second electrodes of the plurality of curvature adjustment units.

19. A method of controlling a virtual display apparatus, the virtual display apparatus comprising a flexible display component layer, wherein the flexible display component layer has a light exit surface and a non-light exit surface opposite to the light exit surface, and the light exit surface is a surface via which light emitted by the flexible display component layer exits therefrom; a lens layer disposed at the light exit surface of the flexible display component layer and configured to converge the light, wherein the lens layer has a first surface facing the flexible display component layer, and the first surface of the lens layer and the light exit surface of the flexible display component layer have a gap therebetween; and a curvature adjustment layer disposed on the non-light exit surface of the flexible display component layer, wherein the curvature adjustment layer is configured to deform in response to at least one deformation signal, so as to adjust distances between the first surface of the lens layer and different positions of the light exit surface of the flexible display component layer along a thickness direction of the lens layer; the virtual display apparatus further comprising a controller, and the method comprising:

receiving, by the controller, image data of an image to be displayed by the flexible display component layer;

obtaining, by the controller, at least one deformation signal according to the image data;

sending, by the controller, the at least one deformation signal to the curvature adjustment layer in response to receiving an adjustment signal, so that the curvature adjustment layer deforms in response to the at least one deformation signal to adjust distances between the first surface of the lens layer and different positions of the light exit surface of the flexible display component layer along the thickness direction of the lens layer;

wherein the curvature adjustment layer includes a plurality of curvature adjustment units, and each curvature adjustment unit includes a first electrode and a second electrode that are disposed oppositely, and an electrorheological fluid located between the first electrode and the second electrode;

obtaining, by the controller, the at least one deformation signal according to the image data, includes:

obtaining, by the controller, voltage signals according to the image data; and sending, by the controller, the at least one deformation signal to the curvature adjustment layer in response to an adjustment signal, so that the curvature adjustment layer deforms in response to the deformation signal, includes:

sending, by the controller, the voltage signals to first electrodes and second electrodes of the plurality of curvature adjustment units in response to the adjustment signal, so as to adjust a state of the electrorheological fluid of each curvature adjustment unit;

wherein obtaining, by the controller, voltage signals according to the image data, further includes:

processing, by the controller, the image data by using a deep neural network model, to determine values of voltages to be applied to a first electrode and a second electrode of each curvature adjustment unit;

wherein the image data includes feature vectors of a plurality of sub-pixel images, each feature vector includes N color dimensions and one depth-of-field dimension, and N is a number of colors of sub-pixels in the flexible display component layer; and processing, by the controller, the image data by using the deep neural network model to determine values of voltages to be applied to the first electrode and the second electrode of each curvature adjustment unit, includes:

processing, by the controller, the feature vectors of the plurality of sub-pixel images by using the deep neural network model to determine the values of voltages to be applied to the first electrode and the second electrode of the curvature adjustment unit corresponding to each sub-pixel image.

* * * * *